US006867092B2

United States Patent
Uchiyama et al.

(10) Patent No.: US 6,867,092 B2
(45) Date of Patent: Mar. 15, 2005

(54) SEMICONDUCTOR INTEGRATED CIRCUIT DEVICE AND THE PROCESS OF MANUFACTURING THE SAME FOR REDUCING THE SIZE OF A MEMORY CELL BY MAKING THE WIDTH OF A BIT LINE THAN A PREDETERMINED MINIMUM SIZE

(75) Inventors: Hiroyuki Uchiyama, Tachikawa (JP); Atsushi Ogishima, Tachikawa (JP); Shoji Shukuri, Koganei (JP)

(73) Assignee: Hitachi, Ltd., Tokyo (JP)

( * ) Notice: Subject to any disclaimer, the term of this patent is extended or adjusted under 35 U.S.C. 154(b) by 95 days.

(21) Appl. No.: 10/013,475

(22) Filed: Dec. 13, 2001

(65) Prior Publication Data

US 2002/0084477 A1 Jul. 4, 2002

Related U.S. Application Data

(62) Division of application No. 09/548,966, filed on Apr. 13, 2000, now Pat. No. 6,762,449.

(30) Foreign Application Priority Data

Apr. 23, 1999 (JP) ............................................ 11-115871

(51) Int. Cl.⁷ ...................... H01L 21/8242; H01L 21/20
(52) U.S. Cl. ........................ 438/244; 438/256; 438/399
(58) Field of Search ................................ 438/239, 241, 438/243, 244, 253–256, 258, 386, 396–399, 618; 257/296, 303–309, 905–908

(56) References Cited

U.S. PATENT DOCUMENTS

| 5,904,556 | A | 5/1999 | Suzuki et al. ................ 438/632 |
| 5,998,254 | A | 12/1999 | Heineck ...................... 438/243 |
| 6,025,623 | A | 2/2000 | Sunouchi et al. ............ 257/304 |
| 6,103,566 | A | 8/2000 | Tamaru et al. .............. 438/240 |
| 6,171,898 | B1 | 1/2001 | Crenshaw et al. .......... 438/240 |
| 6,184,074 | B1 | 2/2001 | Crenshaw et al. .......... 438/238 |
| 6,184,081 | B1 | 2/2001 | Jeng et al. .................. 438/253 |
| 6,197,668 | B1 | 3/2001 | Gardner et al. ............. 438/585 |
| 6,215,144 | B1 | 4/2001 | Saito et al. ................. 257/310 |
| 6,255,685 | B1 | 7/2001 | Kuroda ....................... 257/306 |
| 6,359,301 | B1 * | 3/2002 | Kuroda ....................... 257/306 |

FOREIGN PATENT DOCUMENTS

| JP | 10-200075 | 7/1998 |
| JP | 2000-200886 | 7/2000 |

* cited by examiner

Primary Examiner—Hung Vu
(74) Attorney, Agent, or Firm—Antonelli, Terry, Stout & Kraus, LLP

(57) ABSTRACT

A memory cell of a DRAM is reduced in size by making the width of a bit line finer than the minimum size determined by the limit of resolution of a photolithography. The bit line is made fine by forming a silicon oxide film on the inside wall of a wiring trench formed in a silicon oxide film and by forming the bit line inside the silicon oxide film. The silicon oxide film formed in the trench is deposited so that the silicon oxide film has a thickness thinner than half the width of the wiring trench and in the fine gap inside the silicon oxide film is buried a metal film to be the material of the bit line.

12 Claims, 39 Drawing Sheets

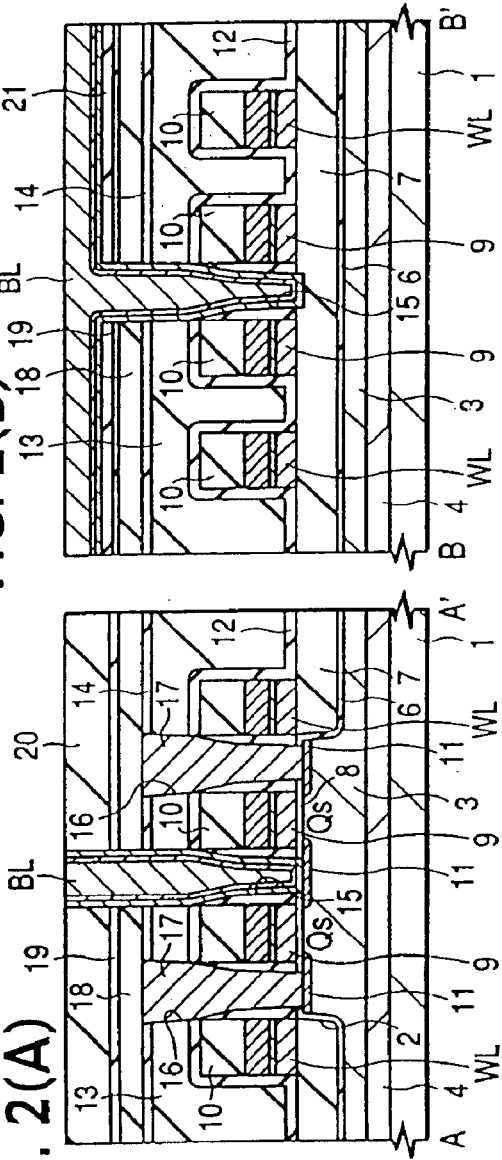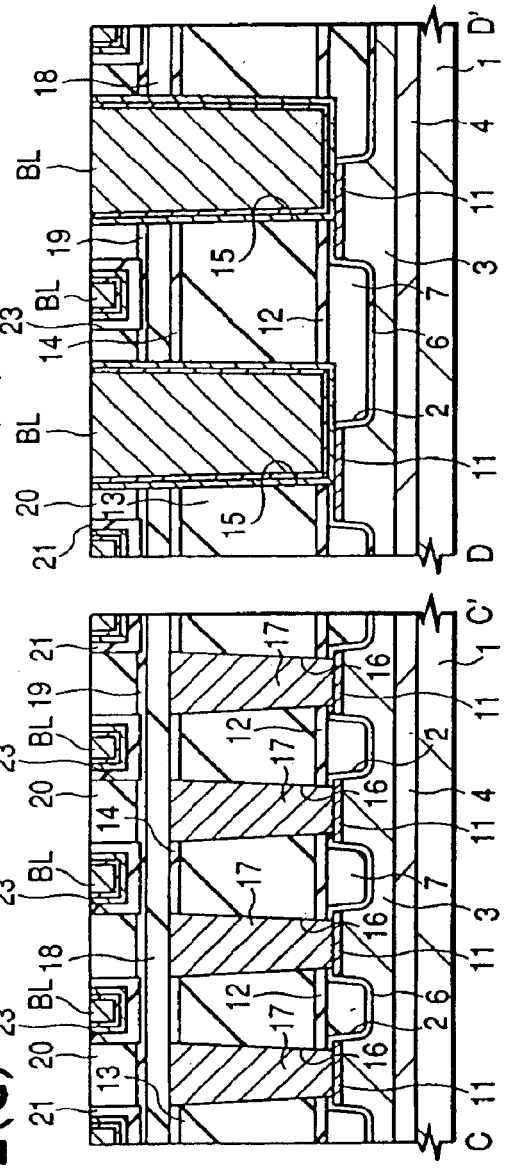

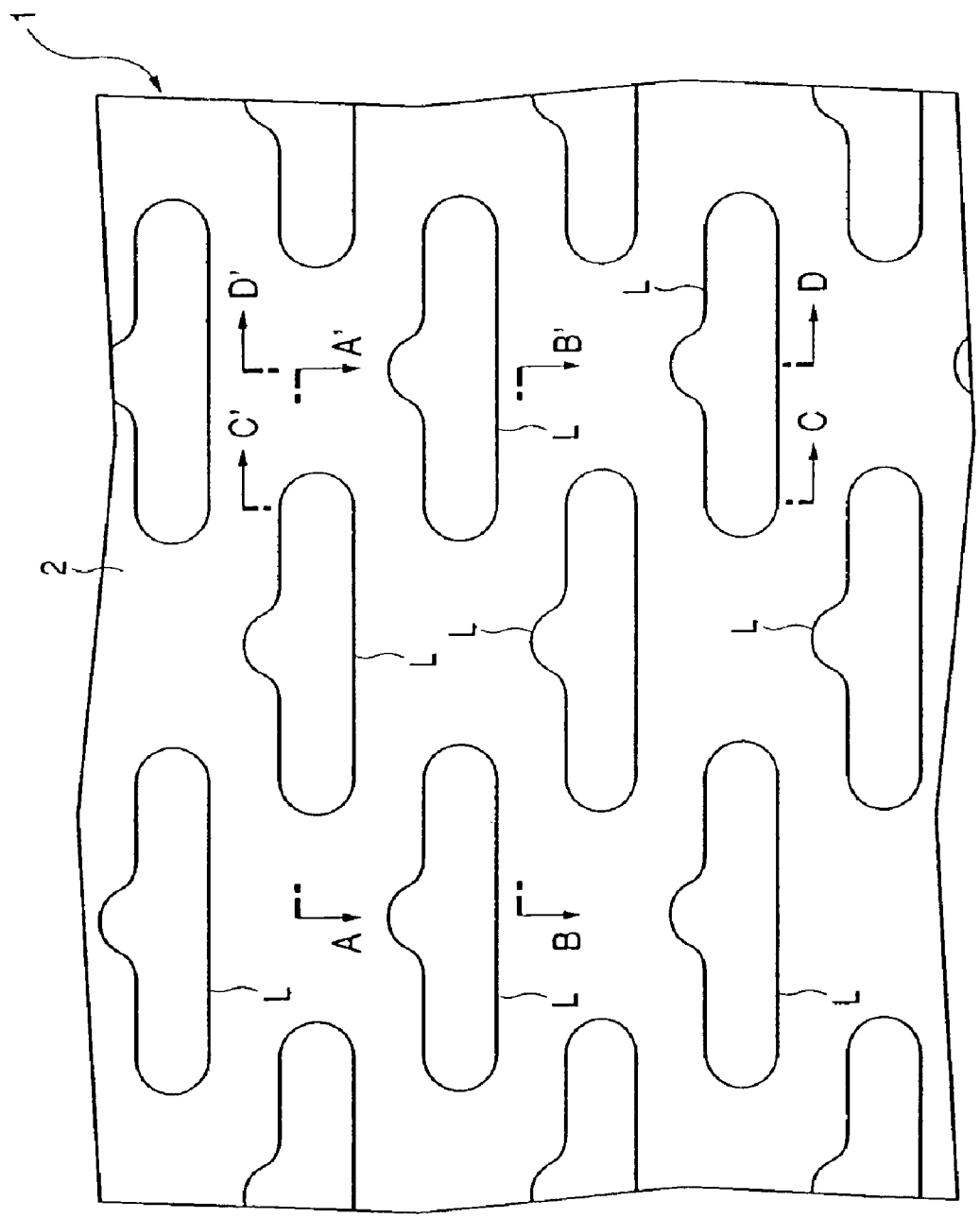

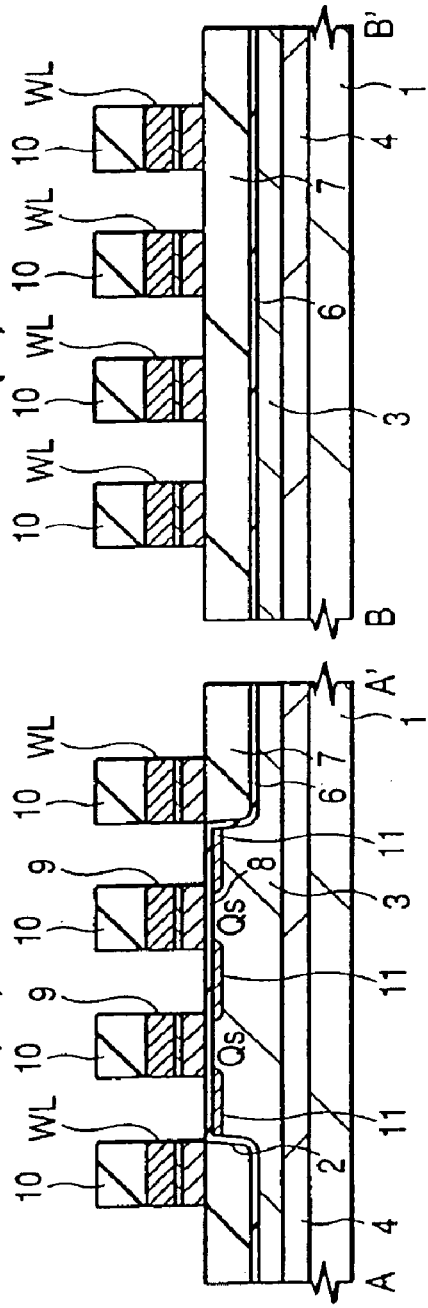
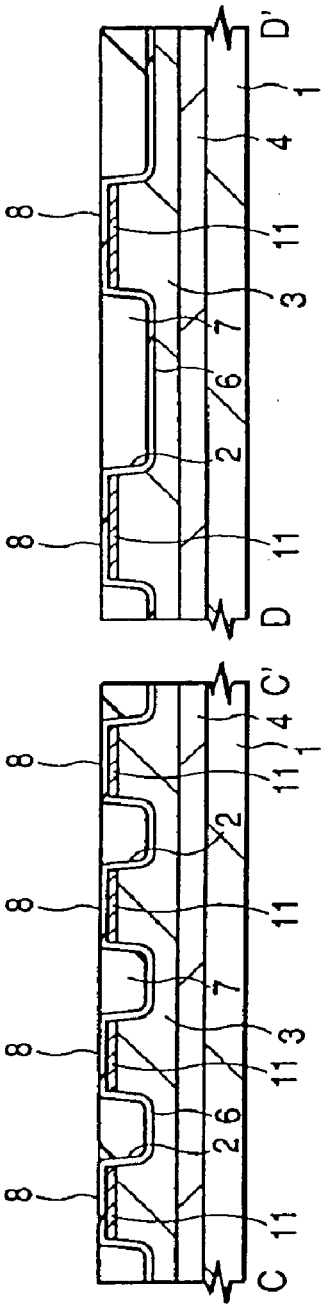

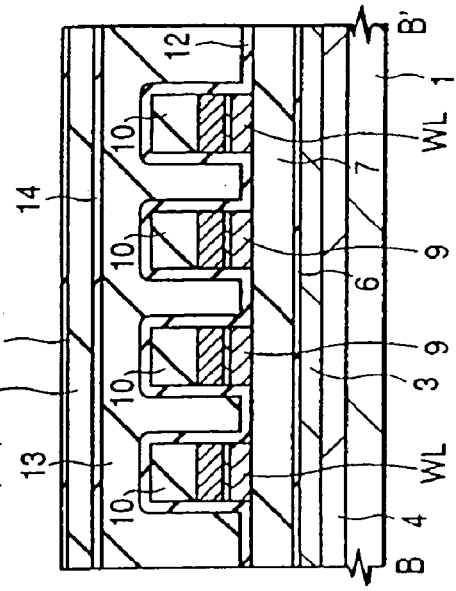
FIG. 13(A)
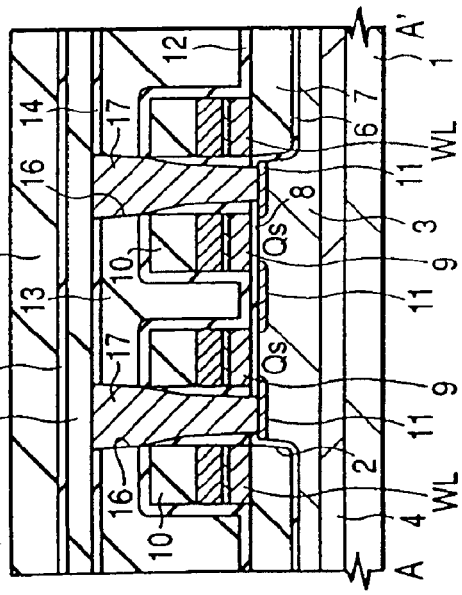
FIG. 13(B)
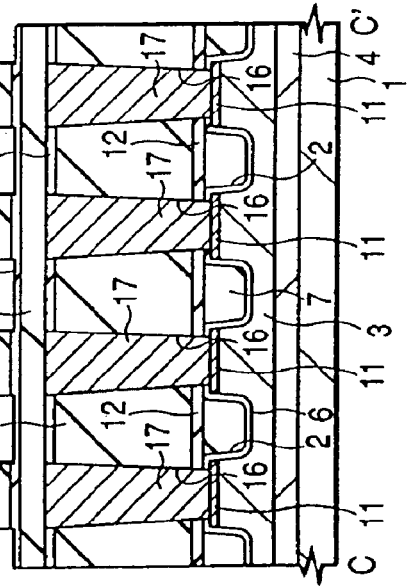
FIG. 13(C)
FIG. 13(D)

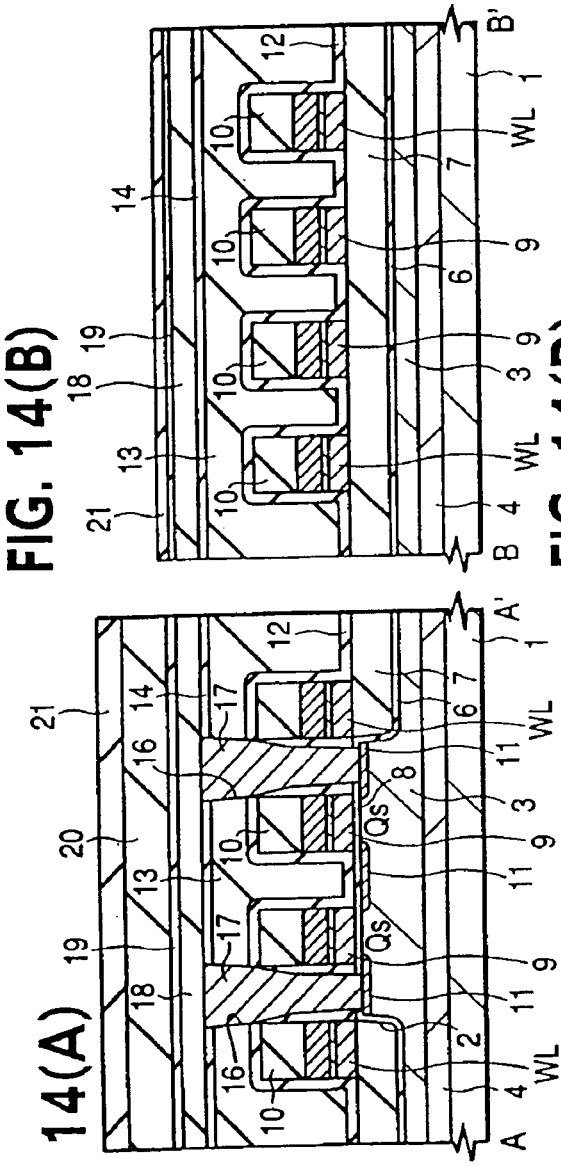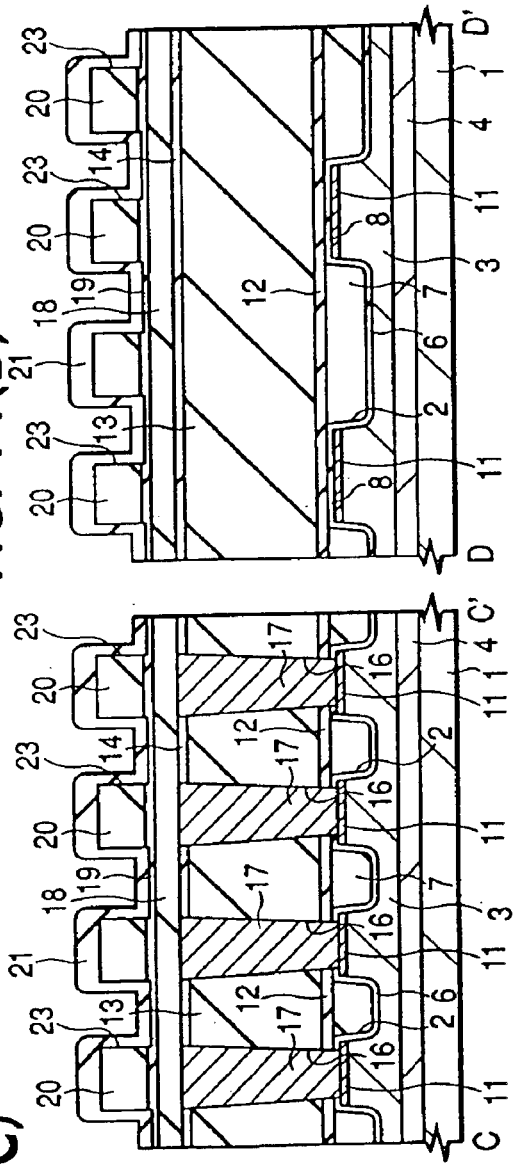

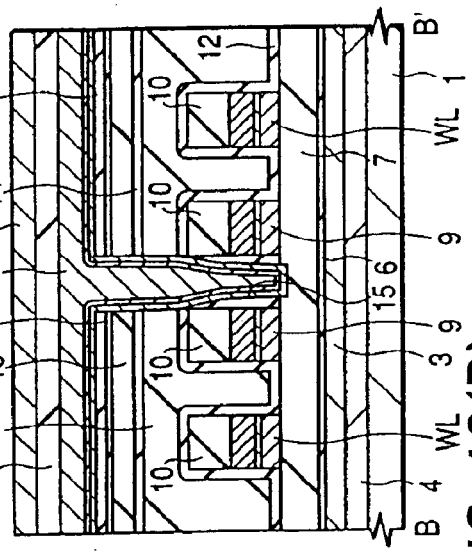
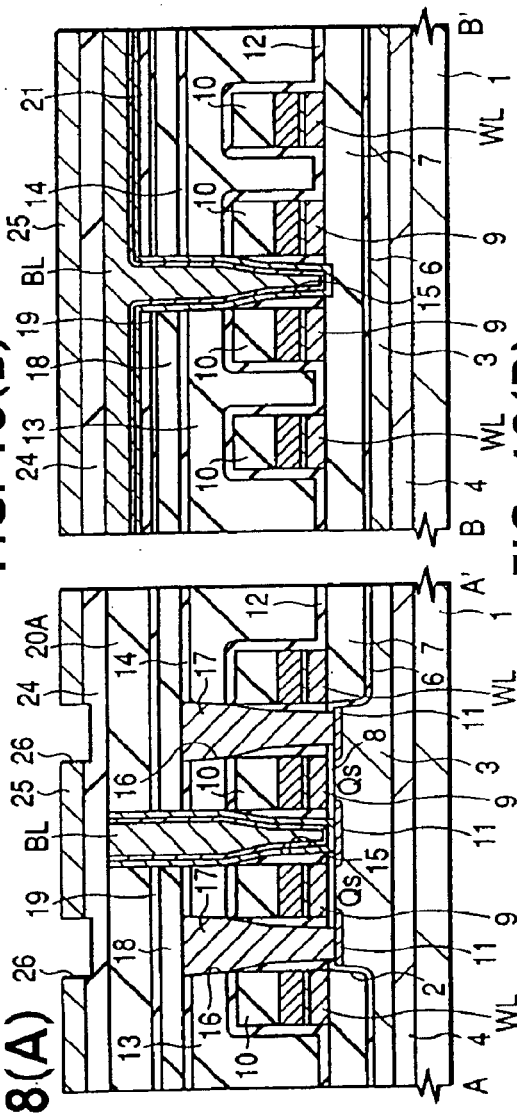
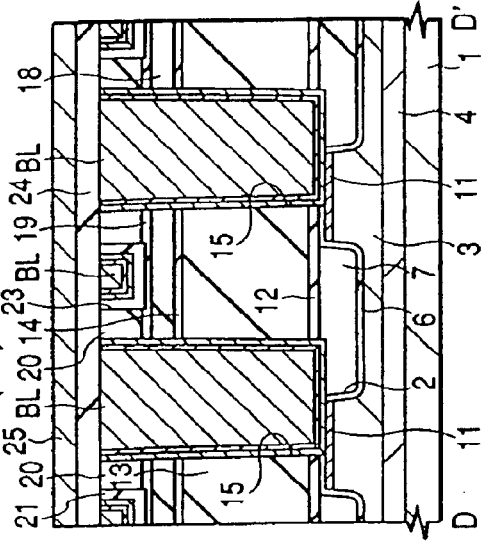
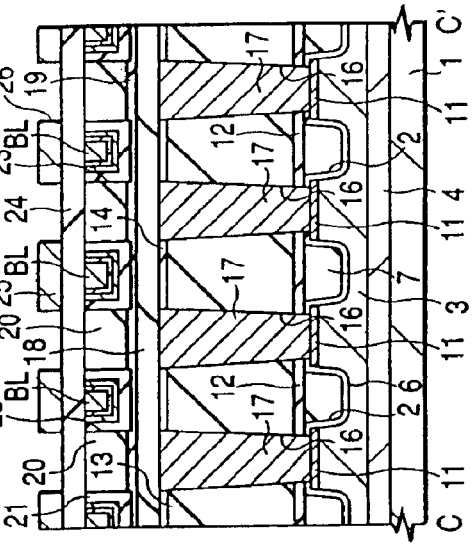

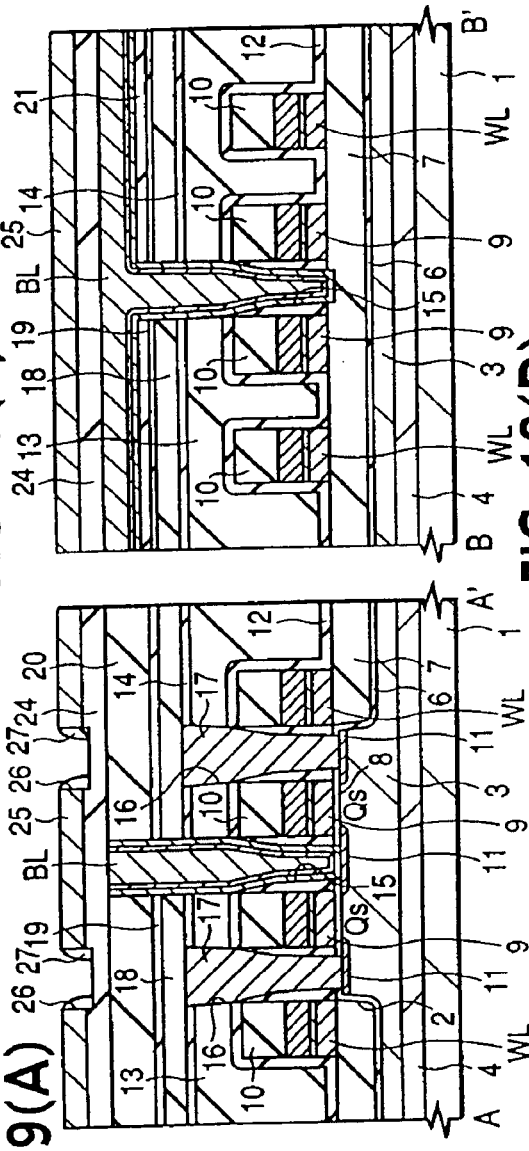
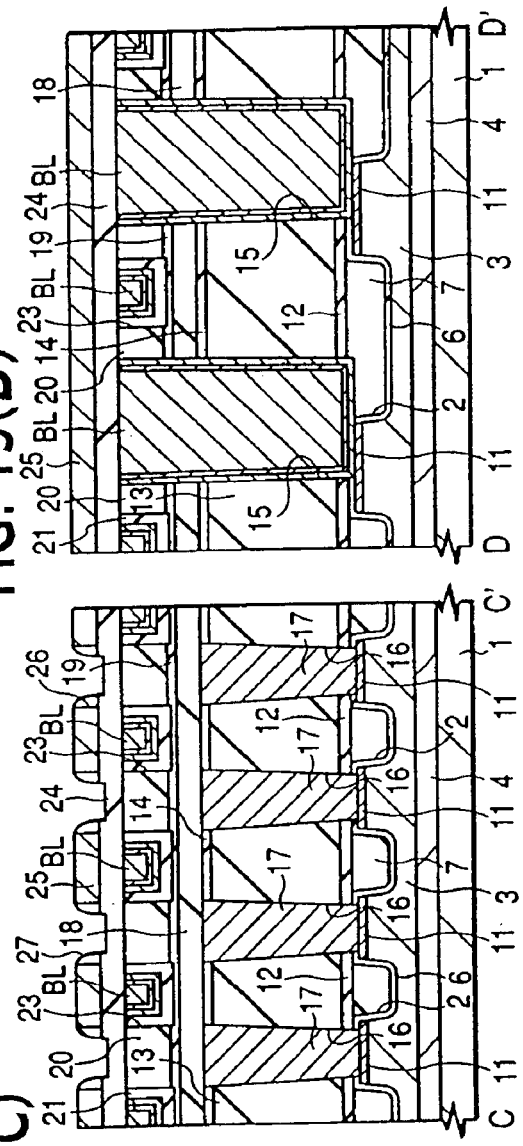
FIG. 19(A)
FIG. 19(B)
FIG. 19(C)
FIG. 19(D)

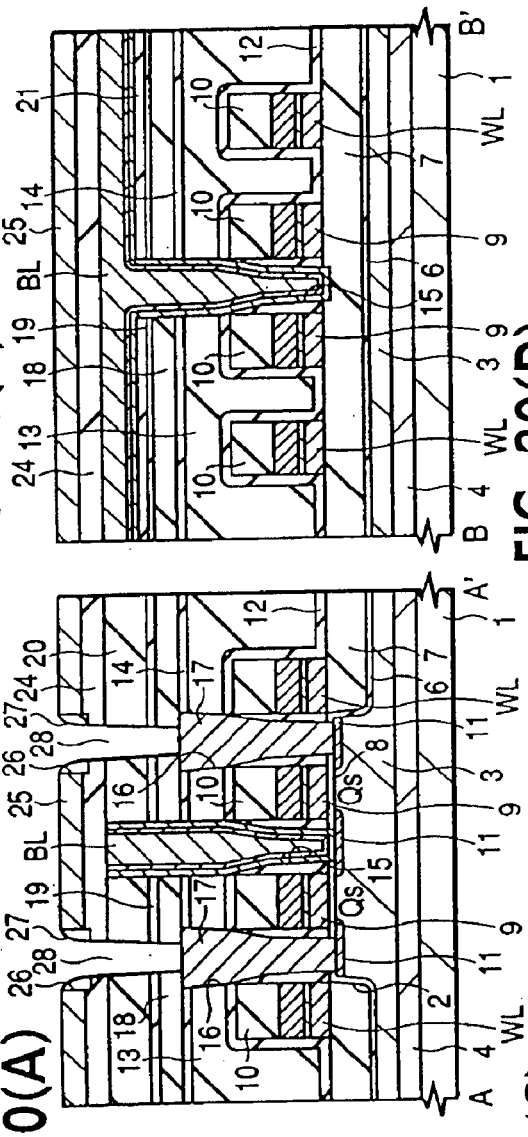

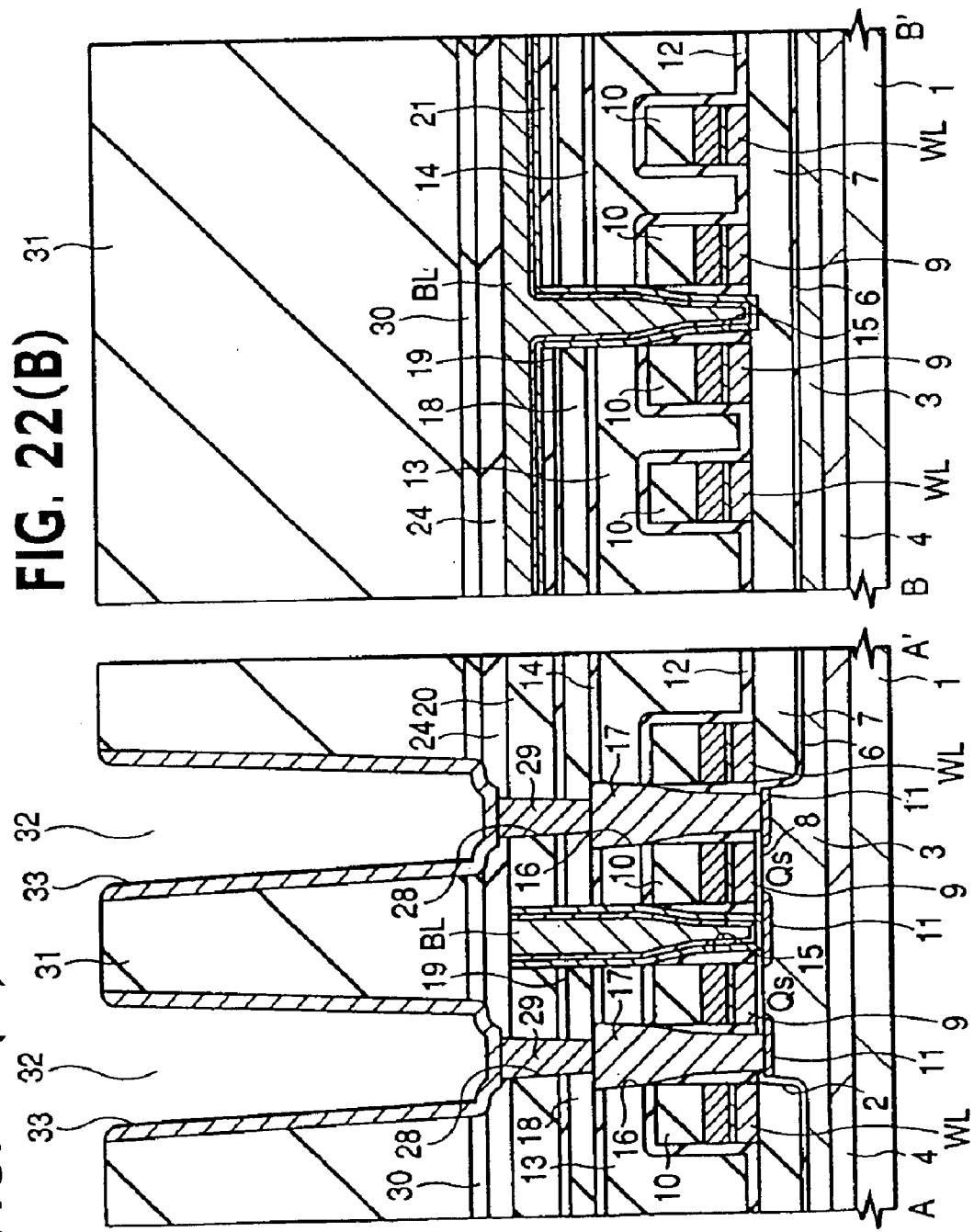

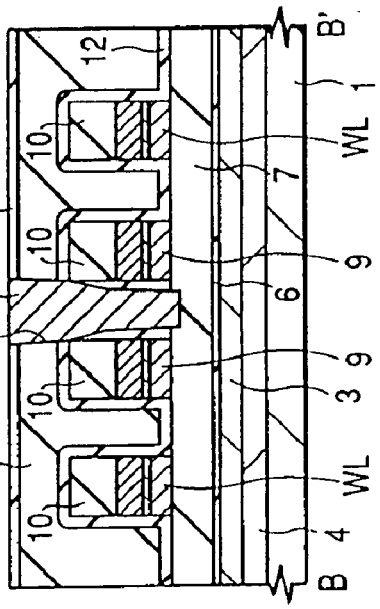
FIG. 26(A)
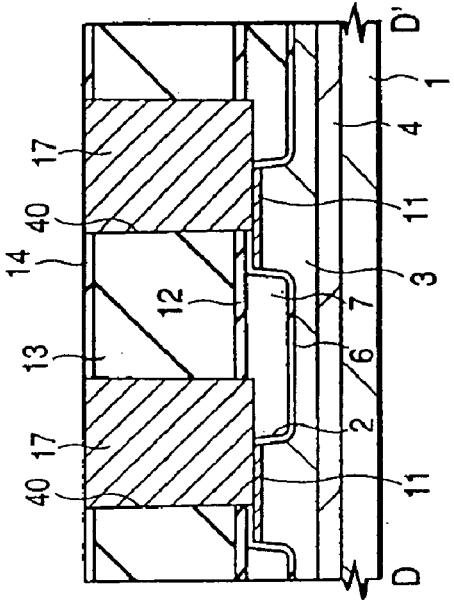
FIG. 26(B)
FIG. 26(C)
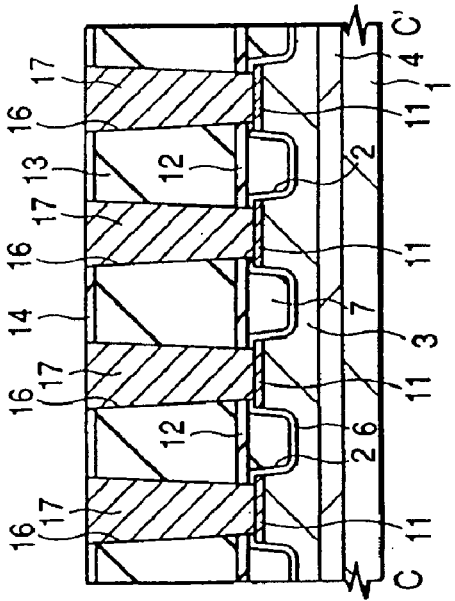
FIG. 26(D)

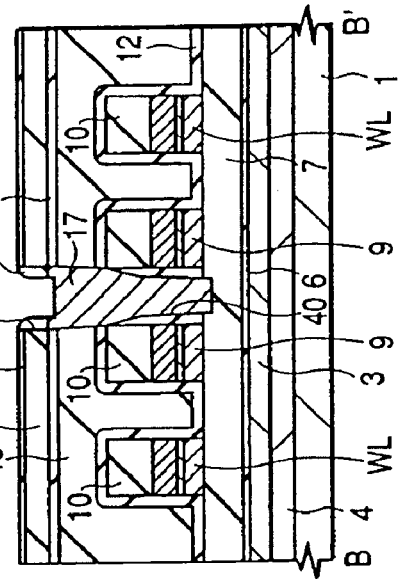
FIG. 30(B)
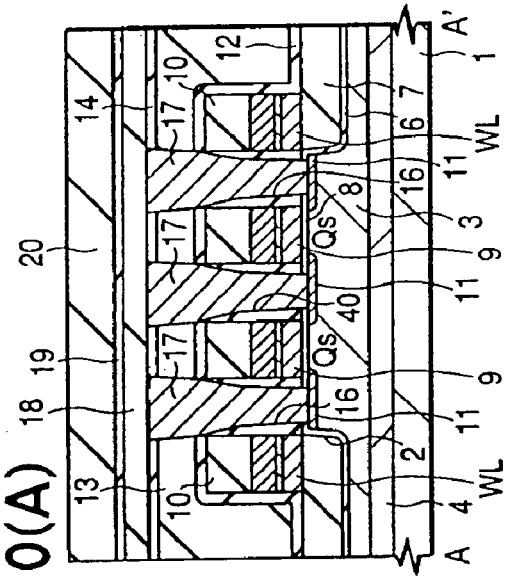
FIG. 30(A)
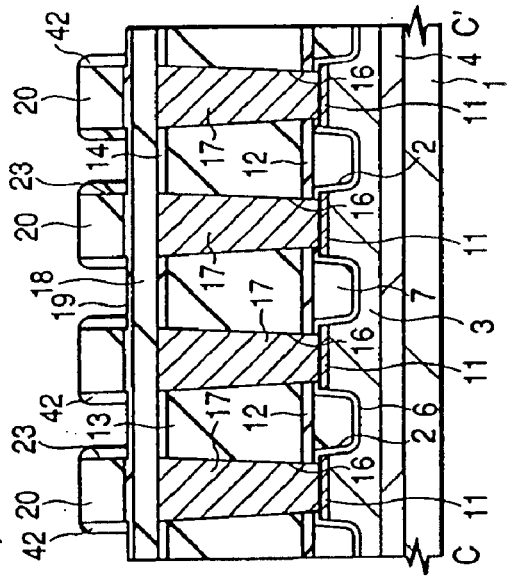
FIG. 30(D)
FIG. 30(C)

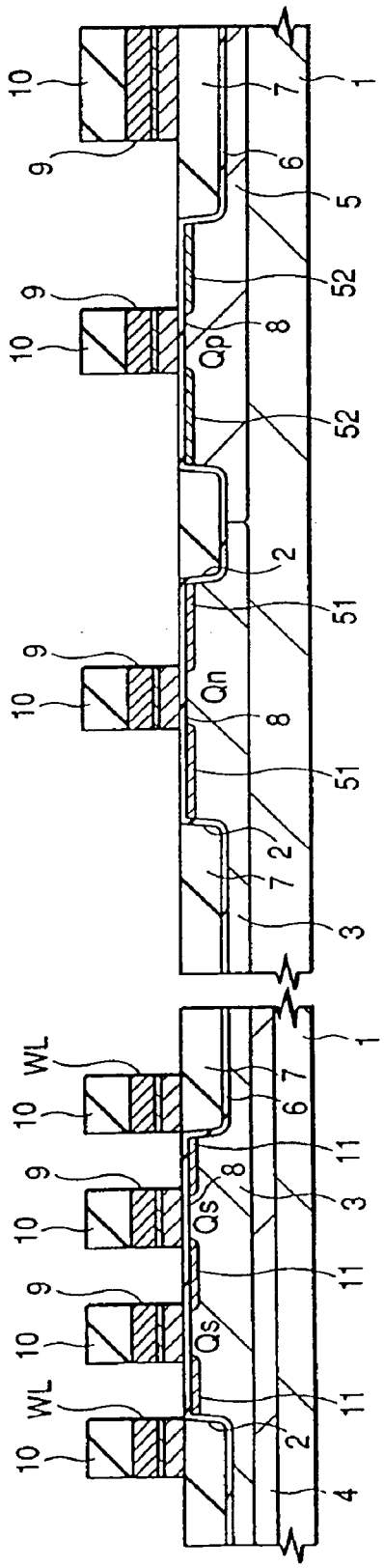
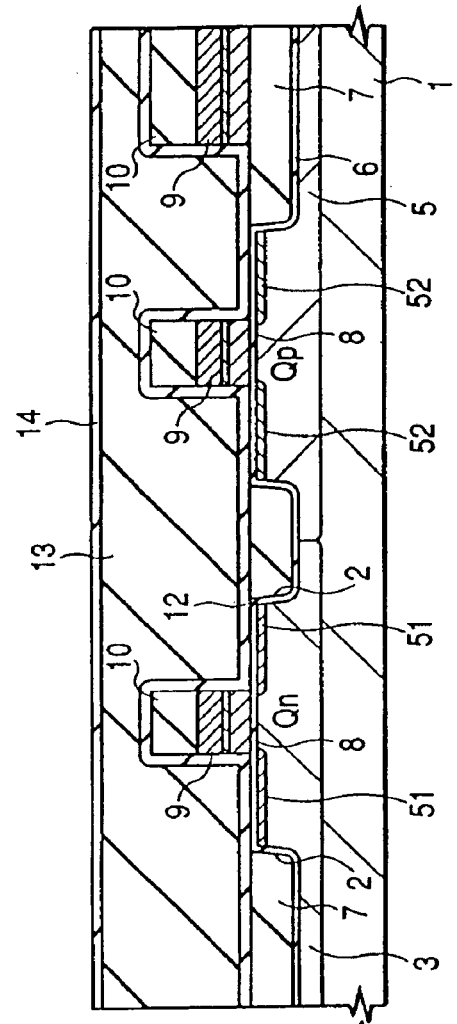
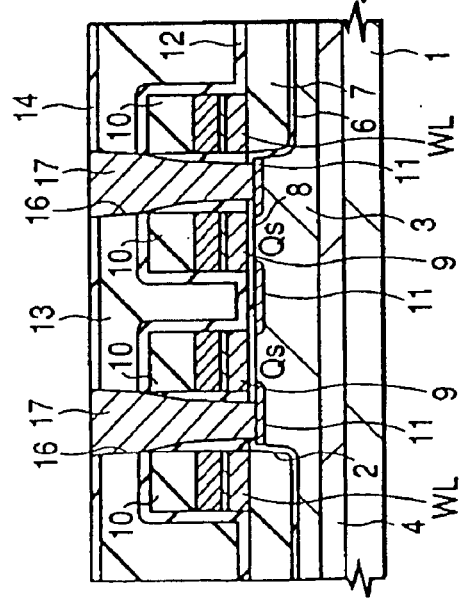

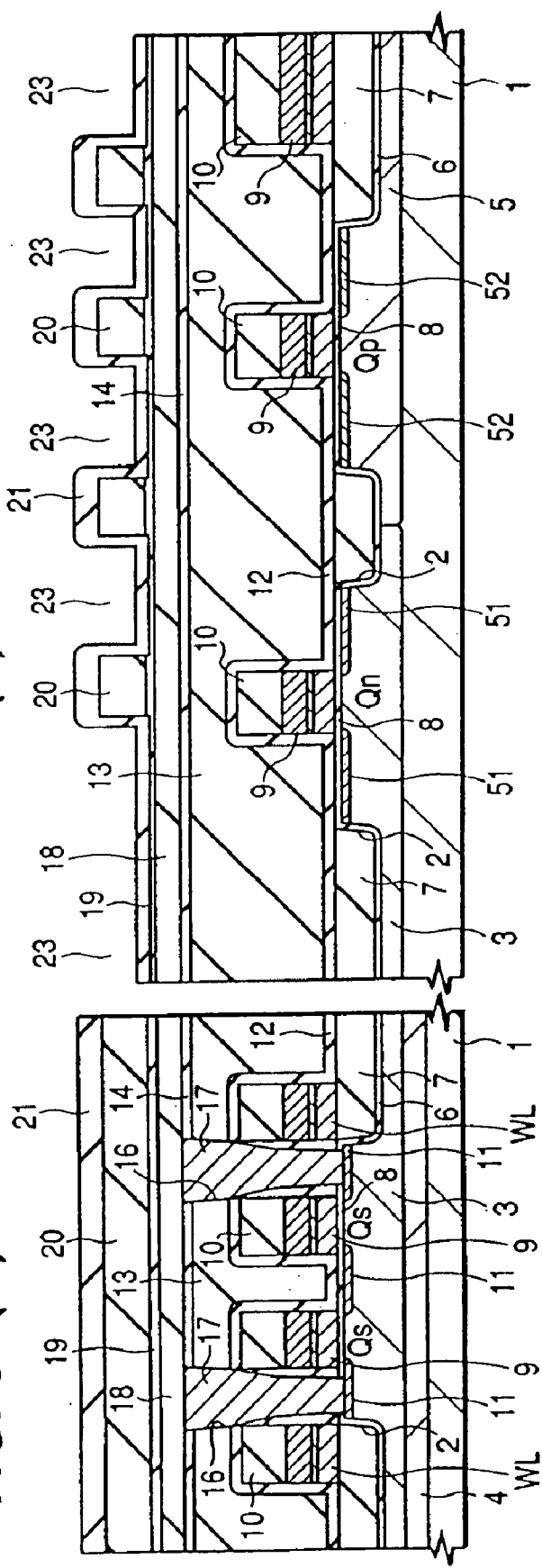

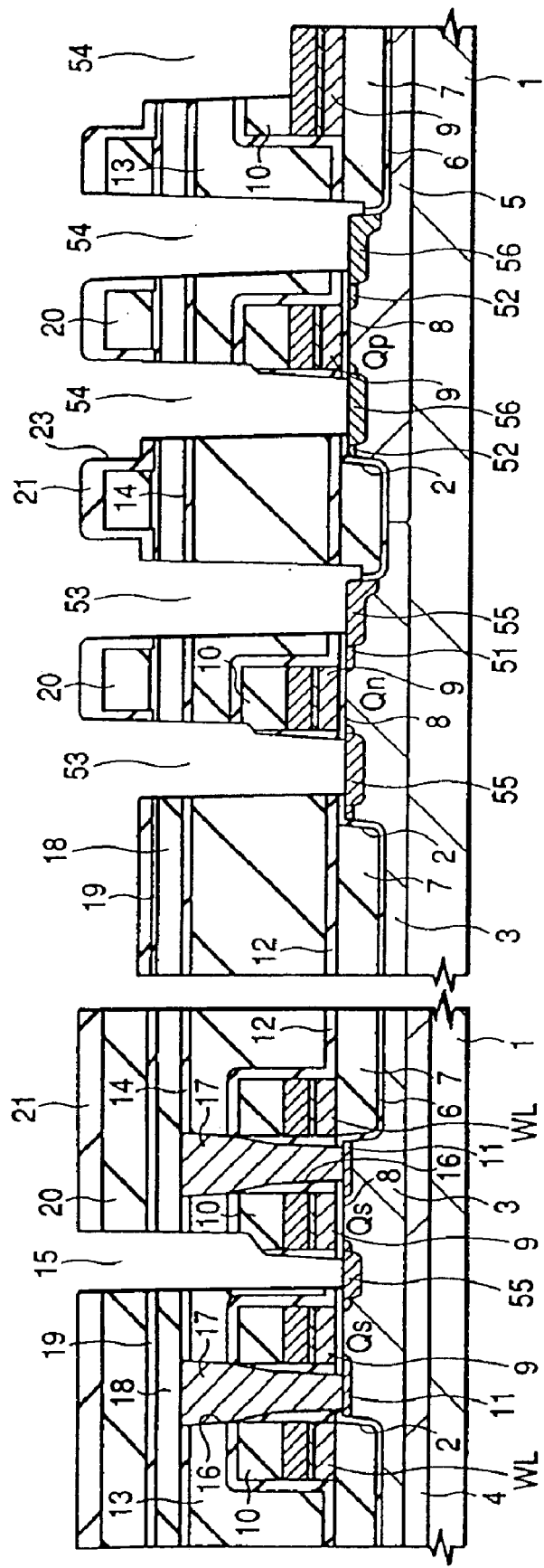

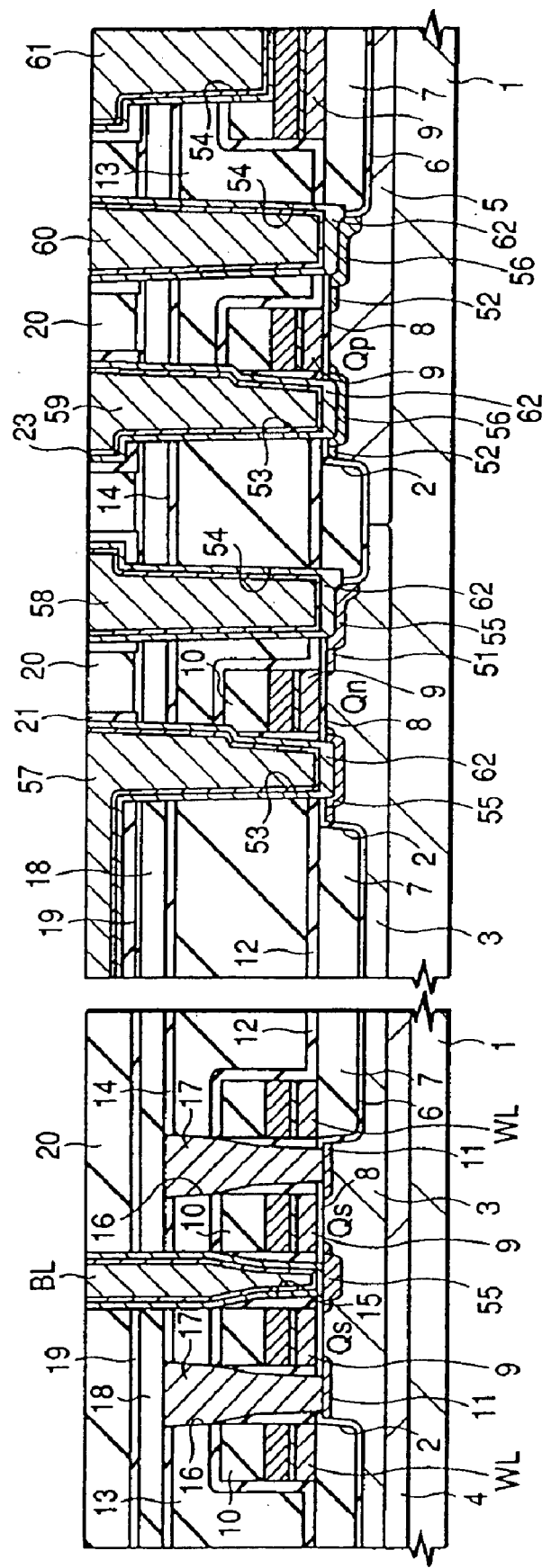

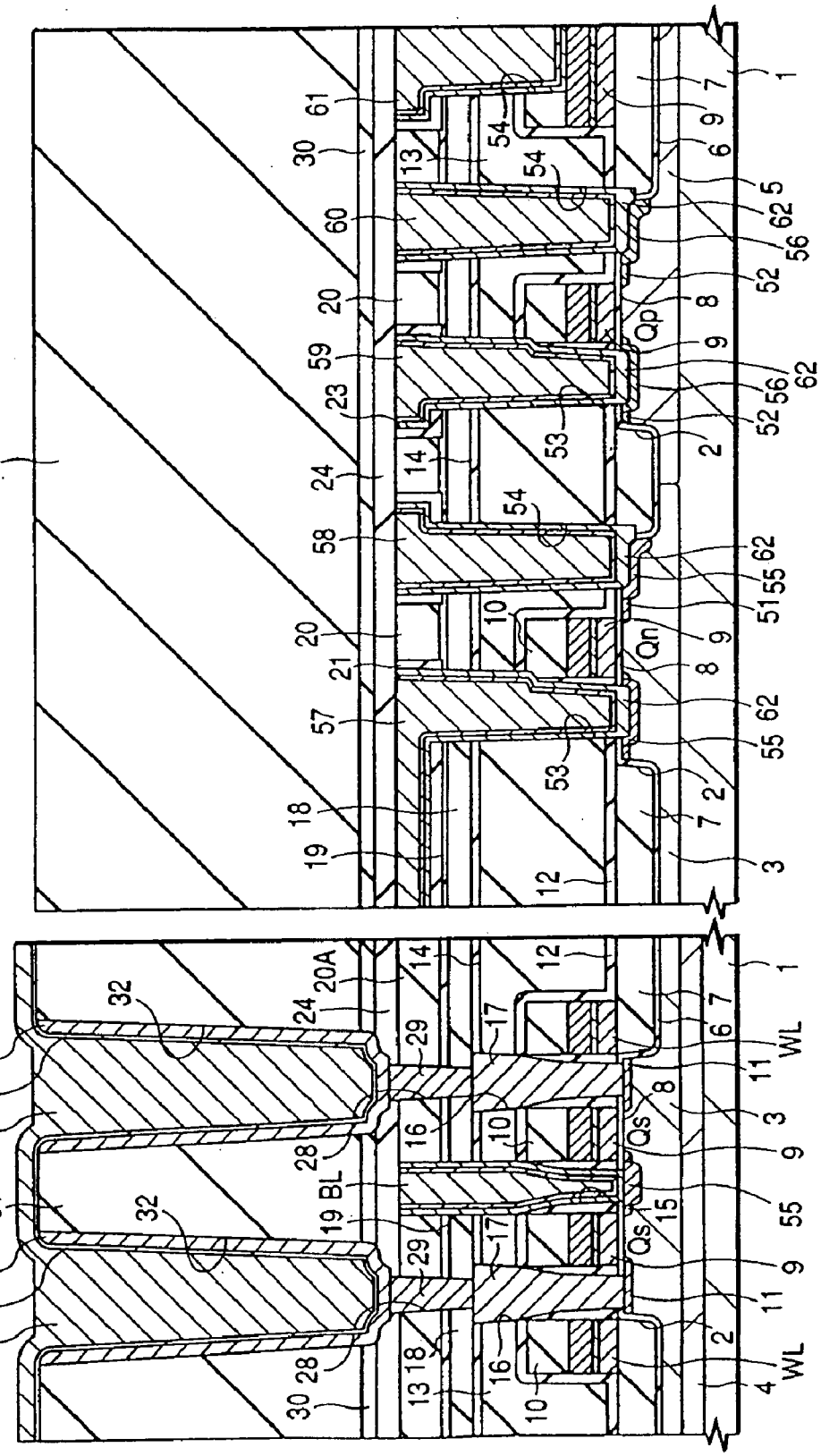

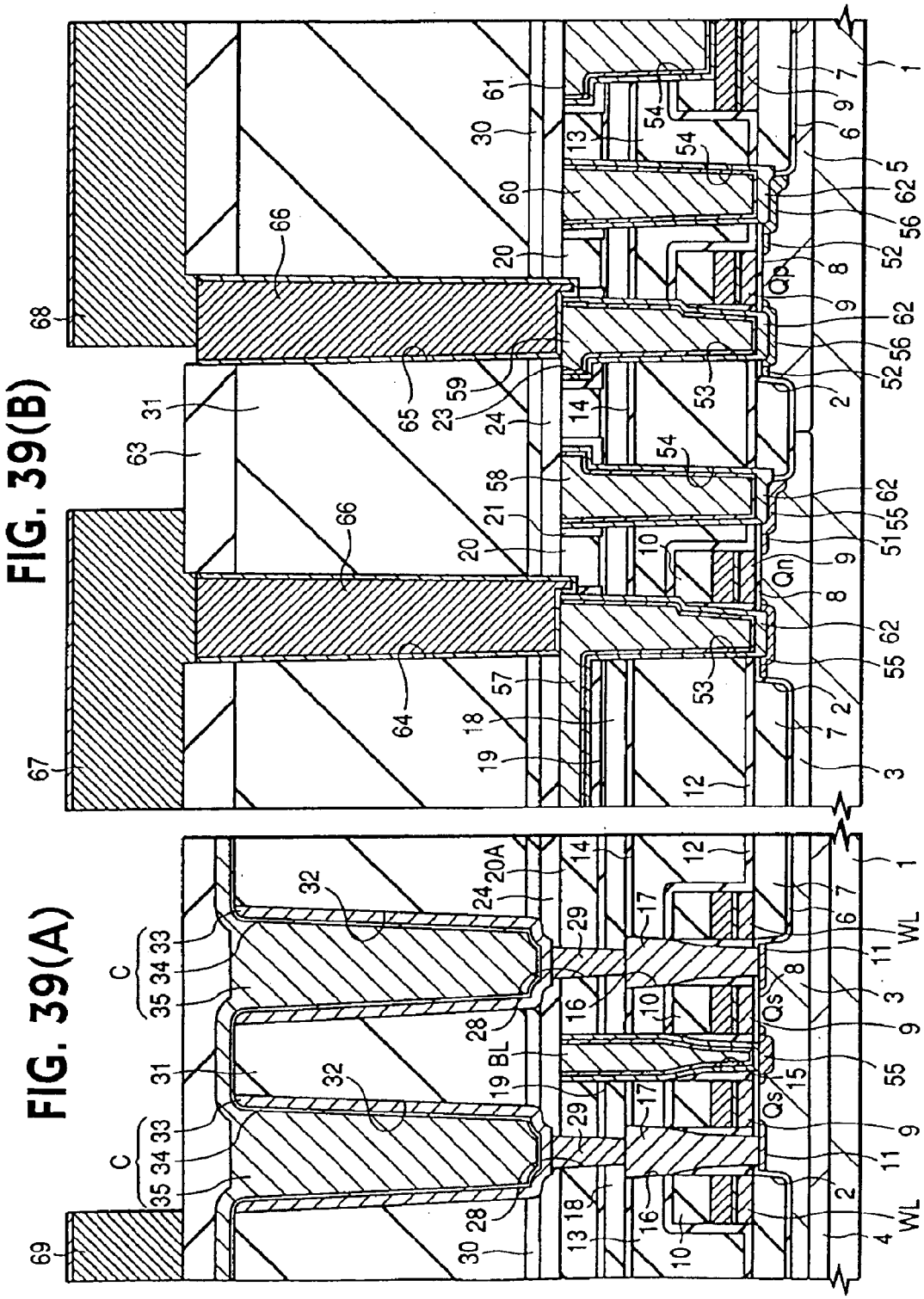

SEMICONDUCTOR INTEGRATED CIRCUIT DEVICE AND THE PROCESS OF MANUFACTURING THE SAME FOR REDUCING THE SIZE OF A MEMORY CELL BY MAKING THE WIDTH OF A BIT LINE THAN A PREDETERMINED MINIMUM SIZE

This is a divisional of parent application Ser. No. 09/548,966, filed Apr. 13, 2000 now U.S. Pat No. 6,762,449, the entire disclosure of which is hereby incorporated by reference.

BACKGROUND OF THE INVENTION

The present invention relates to a semiconductor integrated circuit device and a method of manufacturing the same; and, in particular, the invention relates to a technology applicable to a semiconductor integrated circuit device having a DRAM (dynamic random access memory).

A memory cell in a DRAM is arranged at each of the points of intersection of a plurality of word lines and a plurality of bit lines, which are arranged in the form of a matrix on the main surface of a semiconductor substrate, and the memory cell is constituted by one MISFET (metal insulator semiconductor field effect transistor) for selecting the memory cell and one capacitance element (capacitor) for storing information connected in series thereto.

The above-mentioned MISFET for selecting a memory cell is constituted mainly by a gate oxide film, a gate electrode integrally formed with the word line, and a pair of semiconductor regions which constitute a source and a drain. The capacitance element for storing information is arranged on top of the MISFET for selecting a memory cell and is electrically connected to one of the pair of source and drain. Also, the bit line is arranged on top of the MISFET for selecting a memory cell and is electrically connected to the other of the pair of source and drain.

The above-mentioned DRAM having a capacitance element for storing information on top of a MISFET for selecting a memory cell, that is, having a so-called stacked capacitor structure, adopts either a capacitor-over-bit line (COB) structure in which the capacitance element for storing information is arranged over a bit line or a capacitor-under-bit line (CUB) structure in which the capacitance element for storing information is arranged under the bit line, and the former structure (COB structure) is more suitable for making a finely patterned memory cell. This is because, in order to increase the amount of stored charges of the finely patterned capacitance element for storing information, the capacitance element for storing information is required to have a three-dimensional structure to increase its surface area; and, in the case of the CUB structure in which the bit line is arranged over the capacitance element for storing information, the aspect ratio of a contact hole for connecting the bit line to the MISFET for selecting the memory cell is made extremely large, and, hence, it is difficult to form the contact hole.

SUMMARY OF THE INVENTION

In a DRAM having the COB structure in which the capacitance element for storing information is arranged on the bit line, the bit line is arranged on the MISFET for selecting a memory cell via a silicon oxide film (a first silicon oxide film) and the capacitance element for storing information is arranged on the bit line via a silicon oxide film (a second silicon oxide film). And, one of the pair of source and drain of the MISFET for selecting a memory cell is connected to the bit line through a contact hole formed in the first silicon oxide film and the other of the pair of source and drain of the MISFET for selecting a memory cell is connected to the capacitance element for storing information through a hole formed in the second silicon oxide film through between the gap neighboring bit lines and through a contact hole formed in the first silicon oxide film underlying the through hole formed in the second silicon oxide film.

Accordingly, if the pitch of the bit line is reduced in a DRAM having the COB structure to reduce the size of a memory cell, it is difficult to ensure an alignment allowance between the bit line and the through hole passing the gap between the bit lines, which in turn will present a problem in that a plug buried in the through hole and the bit line may create a short circuit.

As a countermeasure to avoid the drawback described above, it is possible to adopt the so-called self-alignment contact (SAC) technology that the top and the side wall of the bit line is covered with a silicon nitride film and a through hole is made in a self-alignment manner with respect to the bit line by using a difference in etching rate between the silicon nitride film and the second silicon oxide film of the region where the through hole is made.

However, in the case where the self-alignment contact (SAC) technology is adopted in which the surrounding area of the bit line is covered with the silicon nitride film, the dielectric constant of silicon nitride is more than two times that of silicon oxide and hence increases the parasitic capacitance of the bit line, which in turn presents another problem in that it becomes difficult to detect a signal stored in the capacitance element for storing information.

As a second countermeasure to ensure an alignment allowance between the bit line and the through hole, it is possible to adopt a method in which the width of a photoresist film used for patterning a metal film for the bit line is made fine to make the width of the bit line fine. In order to make the width of the photoresist film fine, the photoresist film applied on top of the metal film for the bit line is exposed to light and developed to form a photoresist film having a width determined by the minimum size of the limit of resolution of the photolithography, and then the photoresist film is anisotropically etched to further narrow the width thereof.

However, the above-mentioned method of making the width of the photoresist film fine by etching it in an anisotropic manner presents some difficulty in controlling the amount of etching of the photoresist film with high accuracy, and hence it presents a problem in that the stability in size of the photoresist film is reduced after it is etched. Also, in the case where the metal film is patterned by using the photoresist film having a width finer than the minimum width determined by the limit of resolution of the photolithography, another problem is also presented in that a variation in the amount of etching of the photoresist film increases and the stability in size of the bit line is reduced.

Further, in the case where the photoresist film applied on top of the metal film is finely patterned, still another problem is presented in that a variation in the size of the photoresist caused by halation or the like becomes apparent. Also, when a reflection preventing film or the like is formed on the film underlying the photoresist film as a countermeasure against this problem, a further problem is presented in that the controllability of etching is reduced.

Also, in the manufacturing process of the DRAM having the above-mentioned COB structure, in order to form the capacitance element for storing information on top of the bit line with good yield, it is necessary to deposit a silicon oxide film (a second silicon oxide film) in the gap between the bit lines and on top of the bit line and then to planarize the surface of the silicon oxide film using a CMP method. For this reason, in order to ensure a polishing margin, it is necessary to leave the silicon oxide film to some extent of thickness on top of the bit line, which results in an increase the level of the region where the memory cell is formed (memory array). As a result, this increases the aspect ratio of a connection hole for connecting an Al wiring formed on top of the capacitance element for storing information to the MISFET of the peripheral circuit and hence reduces the manufacturing yield of the connection hole and the reliability in connection of a conductive layer buried in the connection hole.

It is an object of the present invention to provide a technology for reducing the size of a memory cell of a DRAM by making the width of a bit line finer than the minimum size determined by the limit of resolution of photolithography.

It is another object of the present invention to provide a technology for improving the detection sensitivity of a signal stored in a capacitance for storing information by reducing the capacitance parasitic on the bit line.

It is still another object of the present invention to provide a technology for improving the manufacturing yield of a DRAM by reducing the height of a memory array.

The above-mentioned objects and other objects and new features will become apparent from the description of the present specification and its accompanying drawings.

Of the features disclosed in the present specification, typical aspects thereof will be outlined in brief in the following.

(1) A semiconductor integrated circuit device in accordance with the present invention has, on the main surface of a semiconductor substrate, a memory cell including a MISFET for selecting a memory cell which is provided with a gate electrode integrally formed with a word line extending in a first direction, a wiring trench which is formed in an insulating film formed over the MISFET for selecting a memory cell and which extends in a second direction intersecting the first direction, a bit line formed in the wiring trench and electrically connected to one of a pair of source and drain of the MISFET for selecting the memory cell, and a capacitance element for storing information formed over the bit line and electrically connected to the other of the pair of source and drain, wherein a second insulating film is formed over the inside wall of the wiring trench and wherein the bit line is formed inside the second insulating film.

(2) A semiconductor integrated circuit device in accordance with the present invention has, in the above-mentioned aspect 1, the width of the bit line smaller than the interval between the neighboring bit lines.

(3) A semiconductor integrated circuit device in accordance with the present invention has, in the above-mentioned aspect 1, has a part of the bit line buried in a first contact hole formed in the insulating film at the bottom of the wiring trench and directly connected to one of the pair of source and drain.

(4) A semiconductor integrated circuit device in accordance with the present invention has, in the above-mentioned in aspect 1, the bit line electrically connected to one of the pair of source and drain via a plug buried in a first contact hole formed in the insulating film at the bottom of the wiring trench.

(5) A semiconductor integrated circuit device in accordance with the present invention has, in the above-mentioned aspect 3 or aspect 4, the first contact hole which is constituted by a plan pattern having a diameter larger in the first direction than in the second direction and a part of which extends over an active region where the MISFET for selecting a memory cell is formed and the other part of which extends over a device isolating region directly below the bit line.

(6) A semiconductor integrated circuit device in accordance with the present invention has, in the above-mentioned aspect 1, an active region where the MISFET for selecting a memory cell is formed and which is constituted by a plan pattern extending slenderly along the second direction and having a portion projecting in the first direction at the one side of the center thereof.

(7) A semiconductor integrated circuit device in accordance with the present invention has, in the above-mentioned aspect 1, the surface of the bit line which is flush with the surface of the insulating film.

(8) A method of manufacturing a semiconductor integrated circuit device in accordance with the present invention includes the following steps:

(A) forming on the main surface of a semiconductor substrate a MISFET for selecting a memory cell which is provided with a gate electrode integrally formed with a word line extending in a first direction and then forming a first insulating film on the top of the MISFET for selecting a memory cell;

(B) etching the first insulating film to form a second contact hole extending to the other of a pair of source and drain of the MISFET for selecting a memory cell and then forming a plug in the second contact hole;

(c) forming on the top of the first insulating film a third insulating film which is different in an etching rate from the first insulating film and then forming on the top of the third insulating film a fourth insulating film which is different in an etching rate from the third insulating film;

(d) etching the fourth insulating film by using the third insulating film as an etching stopper to form a wiring trench extending in a second direction intersecting the first direction;

(e) forming a second insulating film having a thickness smaller than half the width of the wiring trench on the fourth insulating film including the inside of the wiring trench;

(f) sequentially etching the second insulating film inside the wiring trench, the third insulating film below it, and the first insulating film to form a first contact hole extending to one of the pair of source and drain of the MISFET for selecting a memory cell; and (g) depositing a first conductive film to be the material of a bit line on the second insulating film including the inside of the first contact hole and then polishing the first conductive film and the second insulating film on the fourth insulating film respectively by a chemical mechanical polishing method to form a bit line in each of the wiring trench and the first contact hole.

(9) A method of manufacturing a semiconductor integrated circuit device in accordance with the present invention includes the following steps:

(A) forming on the main surface of a semiconductor substrate a MISFET for selecting a memory cell which is provided with a gate electrode integrally formed with a word line extending in a first direction and then forming a first insulating film on the top of the MISFET for selecting a memory cell;

(B) etching the first insulating film to form a first contact hole extending to one of a pair of source and drain of the MISFET for selecting a memory cell and a second contact hole extending to the other of the pair of source and drain and then forming a plug in each of the first and second contact holes;

(c) forming on the top of the first insulating film a third insulating film which is different in an etching rate from the first insulating film and then forming on the top of the third insulating film a fourth insulating film which is different in an etching rate from the third insulating film;

(d) etching the fourth insulating film by using the third insulating film as an etching stopper to form a wiring trench extending in a second direction intersecting the first direction;

(e) forming a second insulating film on the fourth insulating film including the inside of the wiring trench and then anisotropically etching the second insulating film to form a side wall spacer on the side wall of the wiring trench;

(f) etching the third insulating film in the wiring trench and the first insulating film below the third insulating film to form a first through hole extending to the first contact hole; and (g) depositing a first conductive film to be the material of a bit line on the fourth insulating film including the inside of the first through hole and then polishing the first conductive film by a chemical mechanical polishing method to form a bit line in each of the wiring trench and the first through hole.

(10) A method of manufacturing a semiconductor integrated circuit device in accordance with the present invention is a method in which, in the above-mentioned aspect 8 or aspect 9, the width of a gate electrode integrally formed with the word line and the interval between the gate electrodes are formed in the minimum size determined by the limit of resolution of a photolithography and in which the width of the wiring trench and the interval between the wiring trenches are formed in the minimum size determined by the limit of resolution of the photolithography.

(11) A method of manufacturing a semiconductor integrated circuit device in accordance with the present invention is a method in which, in above-mentioned aspect 8, after the first contact hole extending to one of the pair of source and drain of the MISFET for selecting a memory cell is formed in the step (f), impurity ions of the same conductive type as is used in the pair of source and drain are implanted into one of the pair of source and drain through the first contact hole.

(12) A method of manufacturing a semiconductor integrated circuit device in accordance with the present invention is a method in which, in above-mentioned aspect 8 or aspect 9, after a metal film having a high melting point and to be the material of a bit line is deposited in the first through hole in the step (g), the substrate is annealed to form a silicide layer at the interface between the metal film having a high melting point and the substrate.

(13) A method of manufacturing a semiconductor integrated circuit device in accordance with the present invention further includes the following steps in above-mentioned aspect 8 or aspect 9:

(h) forming a fifth insulating film on the top of the fourth insulating film and then sequentially etching the fifth insulating film, the fourth insulating film underlying the fifth insulating film, the third insulating film, and the first insulating film to form a second through hole extending to the second contact hole;

(i) forming a plug in the second through hole and then forming on the top of the fifth insulating film a sixth insulating film which is different in an etching rate from the fifth insulating film and then forming a seventh insulating film on the top of the sixth insulating film and then forming a trench in the seventh insulating film and the sixth insulating film underlying the seventh insulating film; and (j) forming a capacitance element for storing information in the trench and then electrically connecting the capacitance element for storing information to the other of the pair of source and drain of the MISFET for selecting a memory cell through the second through hole and the second contact hole below the second through hole.

14. A method of manufacturing a semiconductor integrated circuit device in accordance with the present invention is a method in which in the above-mentioned aspect 13, the fifth insulating film and the fourth insulating film are etched away by using the third insulating film as an etching stopper.

15. A method of manufacturing a semiconductor integrated circuit device in accordance with the present invention further includes the following steps in the above-mentioned aspect 13:

(k) forming the MISFET of a peripheral circuit in the step (A);

(l) forming the first layer wiring of a peripheral circuit in the step (g); and (m) forming an eighth insulating film on the top of the capacitance element for storing information after forming the capacitance element for storing information in the step (j) and then sequentially etching the eighth insulating film, the seventh insulating film, the sixth insulating film, and the fifth insulating film to form a through hole extending to the first layer wiring of the peripheral circuit.

(16) A method of manufacturing a semiconductor integrated circuit device in accordance with the present invention is a method in which, in the above-mentioned aspect 15, the eighth insulating film and the seventh insulating film are etched away by using the sixth insulating film as an etching stopper.

BRIEF DESCRIPTION OF THE DRAWINGS

FIG. 2(A) through FIG. 2(D) are cross-sectional views taken along lines A–A'; B–B'; C-C'; and D–D'; respectively, in FIG. 1.

FIG. 4 is a plan view of an essential portion of a substrate showing the method of manufacturing a DRAM of embodiment 1 in accordance with the present invention.

FIG. 7(A) through FIG. 7(D) are cross-sectional views showing the step of the method of manufacturing a DRAM of embodiment 1 as seen along lines A–A'; B–B'; C–C' and D–D'; respectively, in FIG. 6.

FIG. 13(A) through FIG. 13(D) are cross-sectional views showing a step of the method of manufacturing a DRAM of embodiment 1 as seen along lines A–A'; B-B'; C–C' and D–D'; respectively, in FIG. 9.

FIG. 14(A) through FIG. 14(D) are cross-sectional views showing a step of the method of manufacturing a DRAM of embodiment 1 as seen along lines A–A'; B-B'; C–C' and D–D'; respectively, in FIG. 9.

FIG. 18(A) through FIG. 18(D) are cross-sectional views showing a step of the method of manufacturing a DRAM of embodiment 1 as seen along lines A–A'; B-B'; C–C' and D–D'; respectively, in FIG. 15.

FIG. 19(A) through FIG. 19(D) are cross-sectional views showing a step of the method of manufacturing a DRAM of embodiment 1 as seen along lines A–A'; B-B'; C–C' and D–D'; respectively, in FIG. 15.

FIG. 20(A) through FIG. 20(D) are cross-sectional views showing a step of the method of manufacturing a DRAM of embodiment 1 as seen along lines A–A'; B-B'; C–C' and D–D'; respectively, in FIG. 15.

FIGS. 22(A) and 22(B) are a cross-sectional views showing a step of the method of manufacturing a DRAM of embodiment 1 as seen along lines A–A'; B-B'; C–C' and D–D'; respectively, in FIG. 15.

FIG. 26(A) through FIG. 26(D) are cross-sectional views showing a step of the method of manufacturing a DRAM of embodiment 2 as seen along lines A–A'; B-B'; C–C' and D–D'; respectively, in FIG. 1.

FIG. 30(A) through FIG. 30(D) are cross-sectional views showing a step of the method of manufacturing a DRAM of embodiment 2 as seen along lines A–A'; B-B'; C–C' and D–D'; respectively, in FIG. 1.

FIGS. 32(A) and 32(B) are cross-sectional views showing a step of the method of manufacturing a DRAM of embodiment 3 in accordance with the present invention.

FIGS. 33(A) and 33(B) are cross-sectional views showing a step of the method of manufacturing a DRAM of embodiment 3 in accordance with the present invention.

FIGS. 34(A) and 34(B) are cross-sectional views showing a step of the method of manufacturing a DRAM of embodiment 3 in accordance with the present invention.

FIGS. 36(A) and 36(B) are cross-sectional views showing a step of the method of manufacturing a DRAM of embodiment 3 in accordance with the present invention.

FIGS. 37(A) and 37(B) are cross-sectional views showing a step of the method of manufacturing a DRAM of embodiment 3 in accordance with the present invention.

FIGS. 38(A) and 38(B) are cross-sectional views showing a step of the method of manufacturing a DRAM of embodiment 3 in accordance with the present invention.

FIGS. 39(A) and 39(B) are cross-sectional views showing a step of the method of manufacturing a DRAM of embodiment 3 in accordance with the present invention.

DESCRIPTION OF THE PREFERRED EMBODIMENTS

Figure 1:
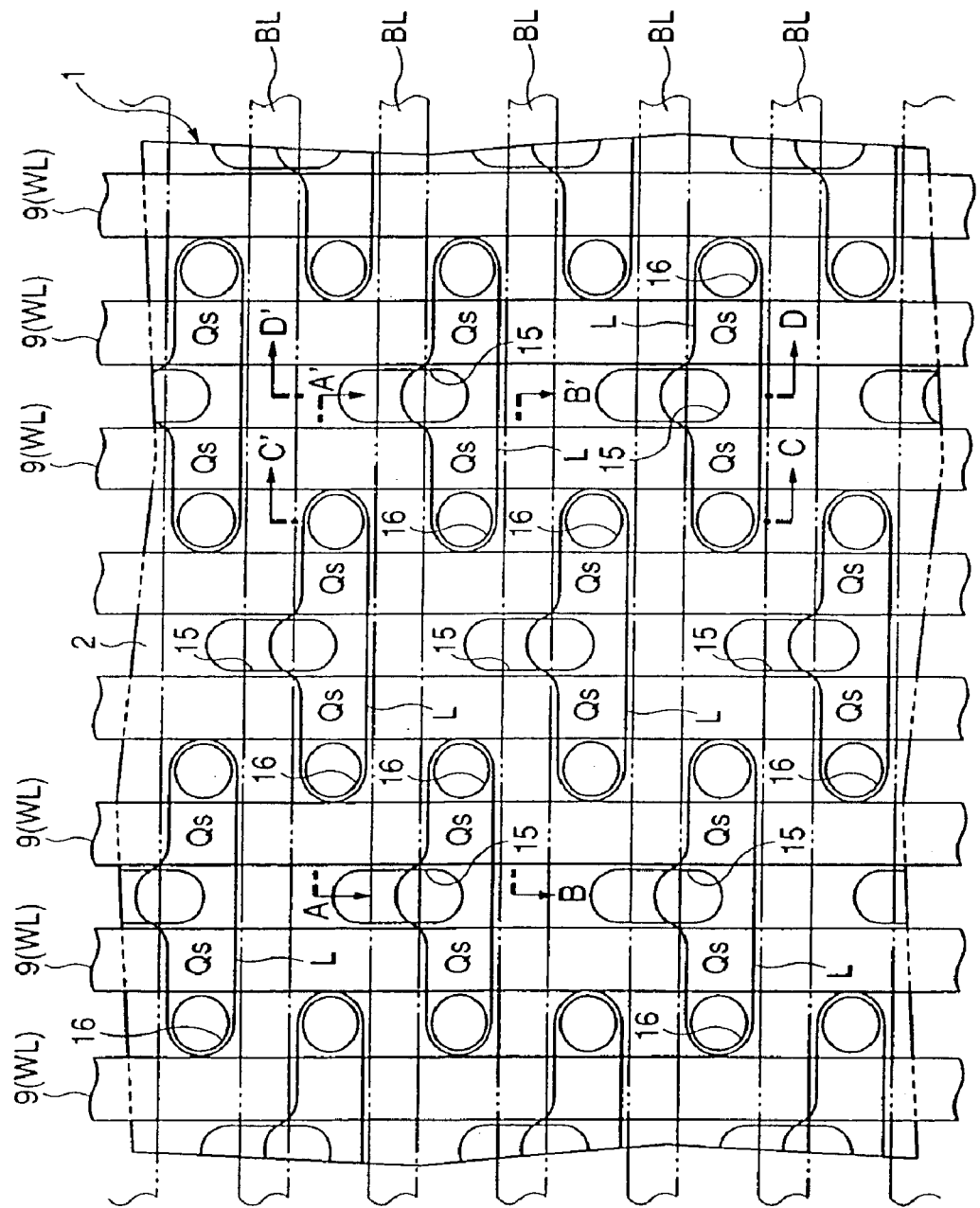
FIG. 1 is a plan view of an essential portion of a substrate showing a memory cell in the process of manufacturing a DRAM of a preferred embodiment 1 in accordance with the present invention.
Figure 3A:
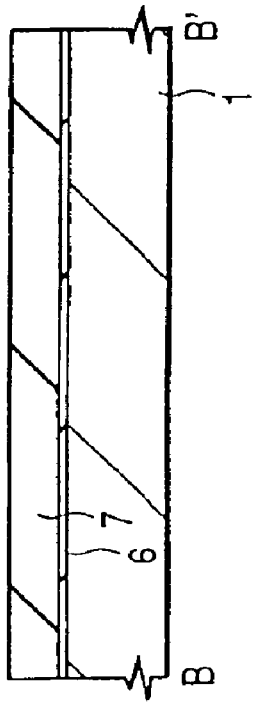
FIG. 3(A) through FIG. 3(D) are cross-sectional views showing a step of the method of manufacturing a DRAM of embodiment 1 in as seen along lines A–A'; B-B'; C–C' and D–D'; respectively, in FIG. 4.
Figure 3B:
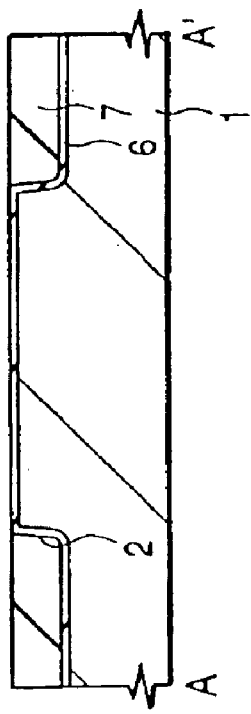
Figure 3C:
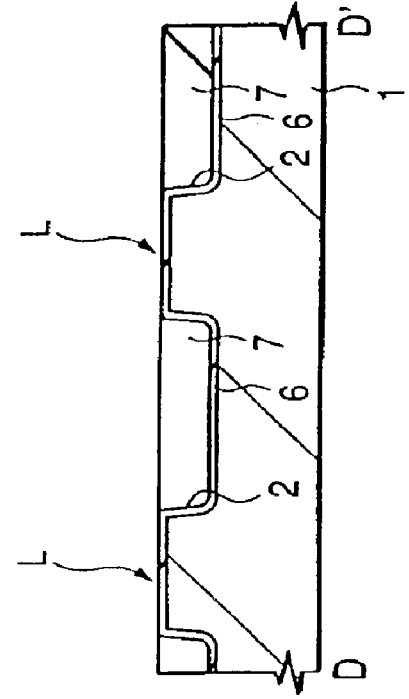
Figure 3D:
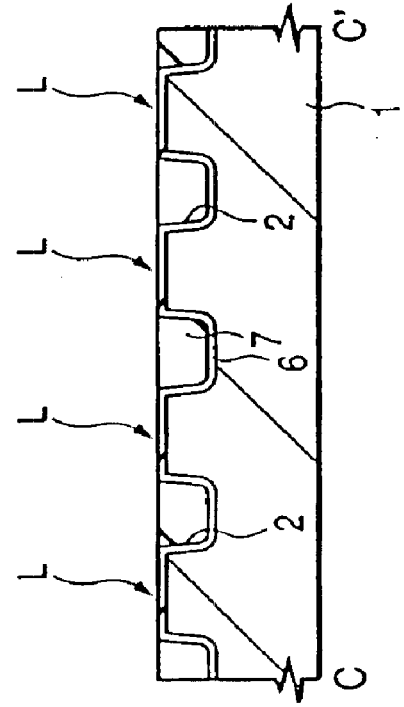
Figure 5A:
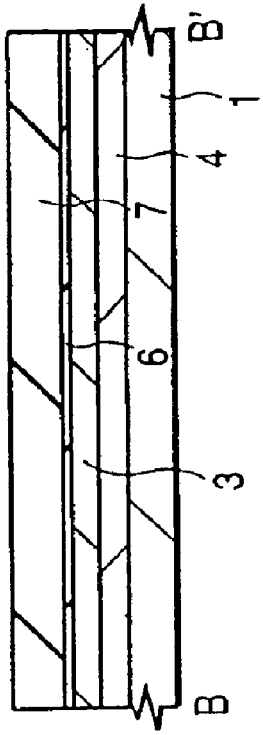
FIG. 5(A) through FIG. 5(D) are cross-sectional views showing a step of the method of manufacturing a DRAM of embodiment 1 as seen along lines A–A'; B–B'; C–C' and D–D'; respectively, in FIG. 4.
Figure 5B:
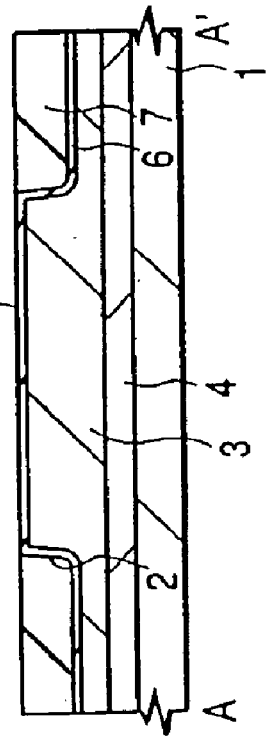
Figure 5C:
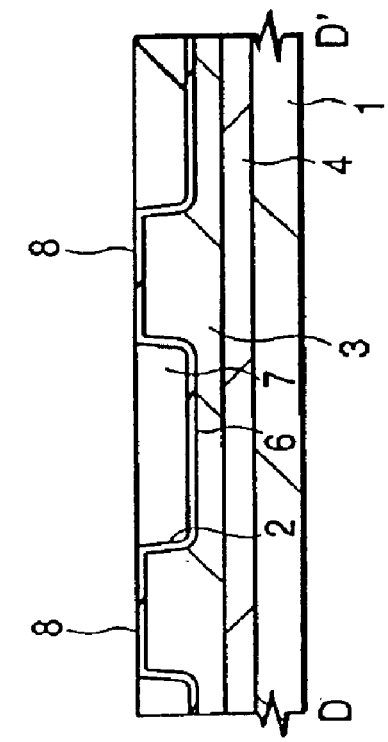
Figure 5D:
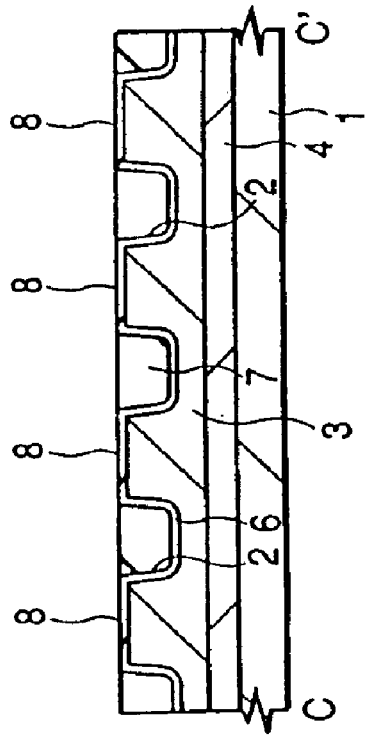
Figure 6:
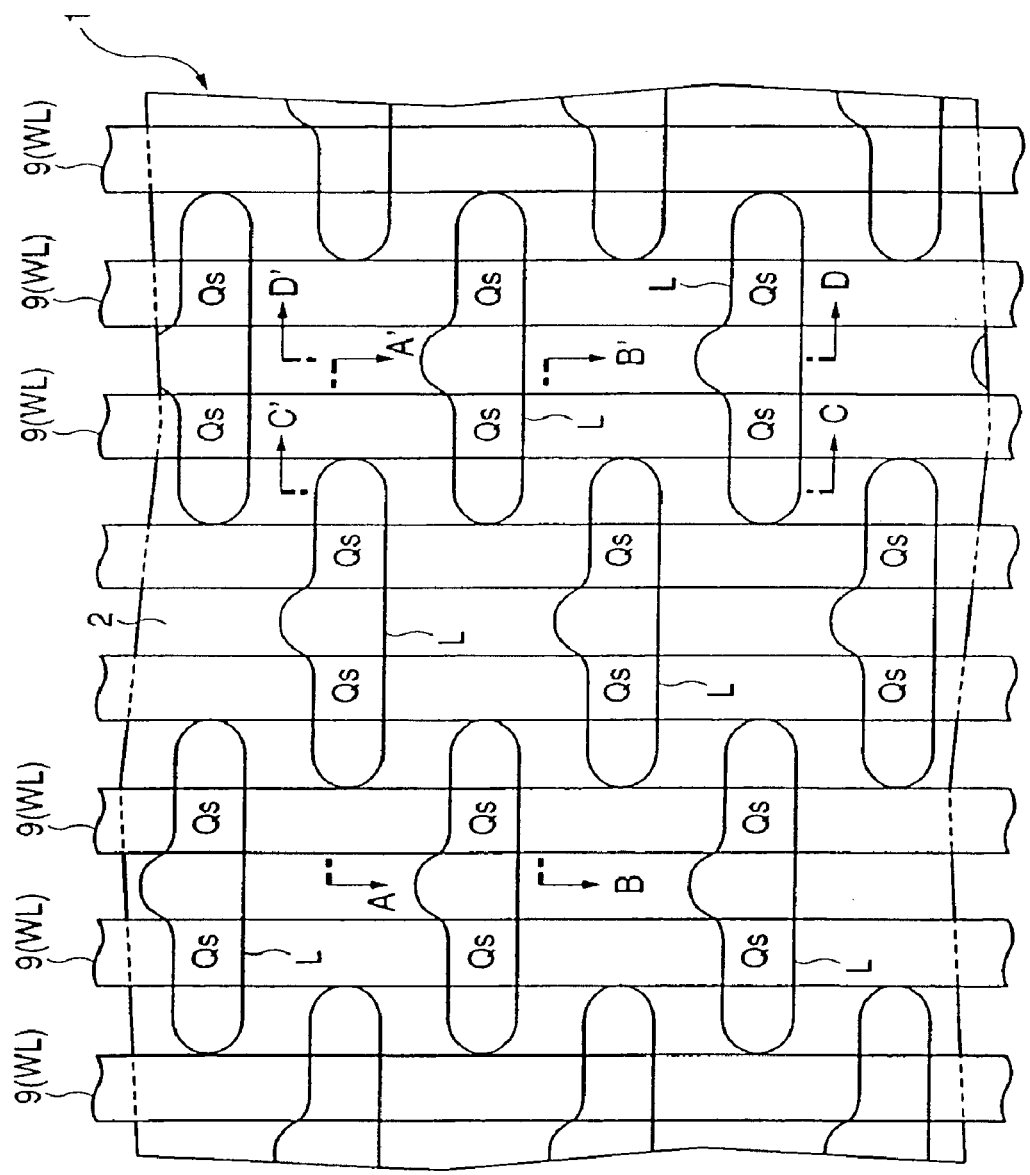
FIG. 6 is a plan view of an essential portion of a substrate showing the method of manufacturing a DRAM of embodiment 1 in accordance with the present invention.
Figure 8A:
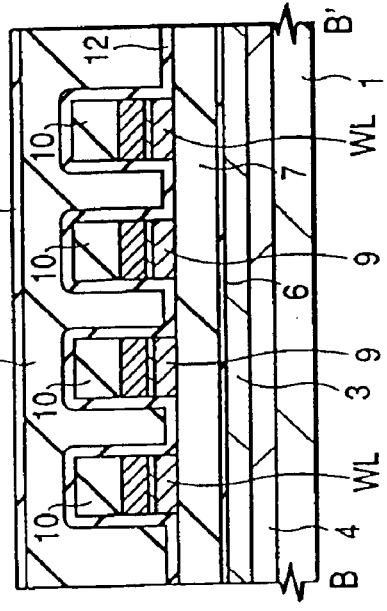
FIG. 8(A) through FIG. 8(D) are cross-sectional views of showing the step of the method of manufacturing a DRAM of embodiment 1 as seen along lines A–A'; B–B'; C–C' and D–D'; respectively, in FIG. 6.
Figure 8B:
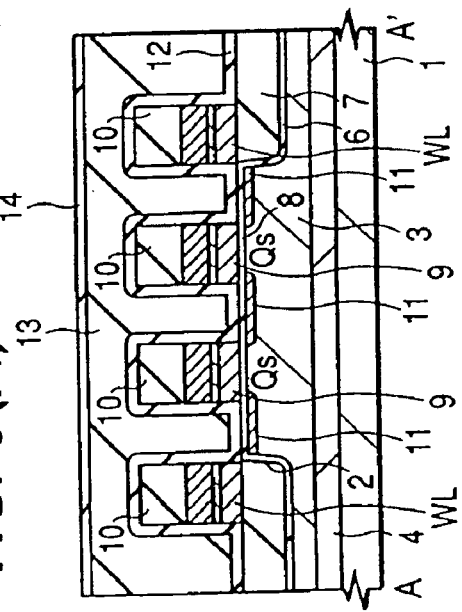
Figure 8C:
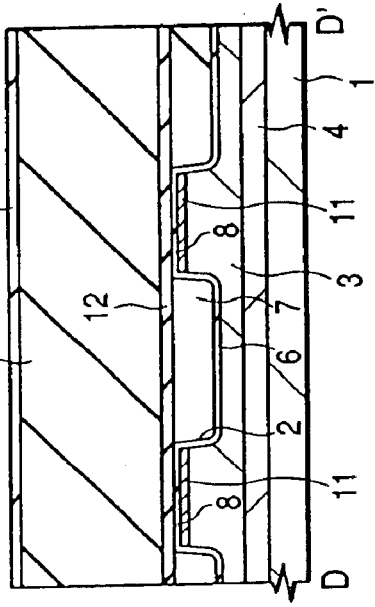
Figure 8D:
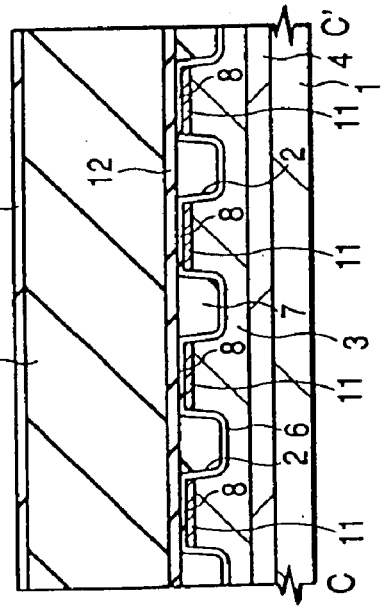
Figure 9:
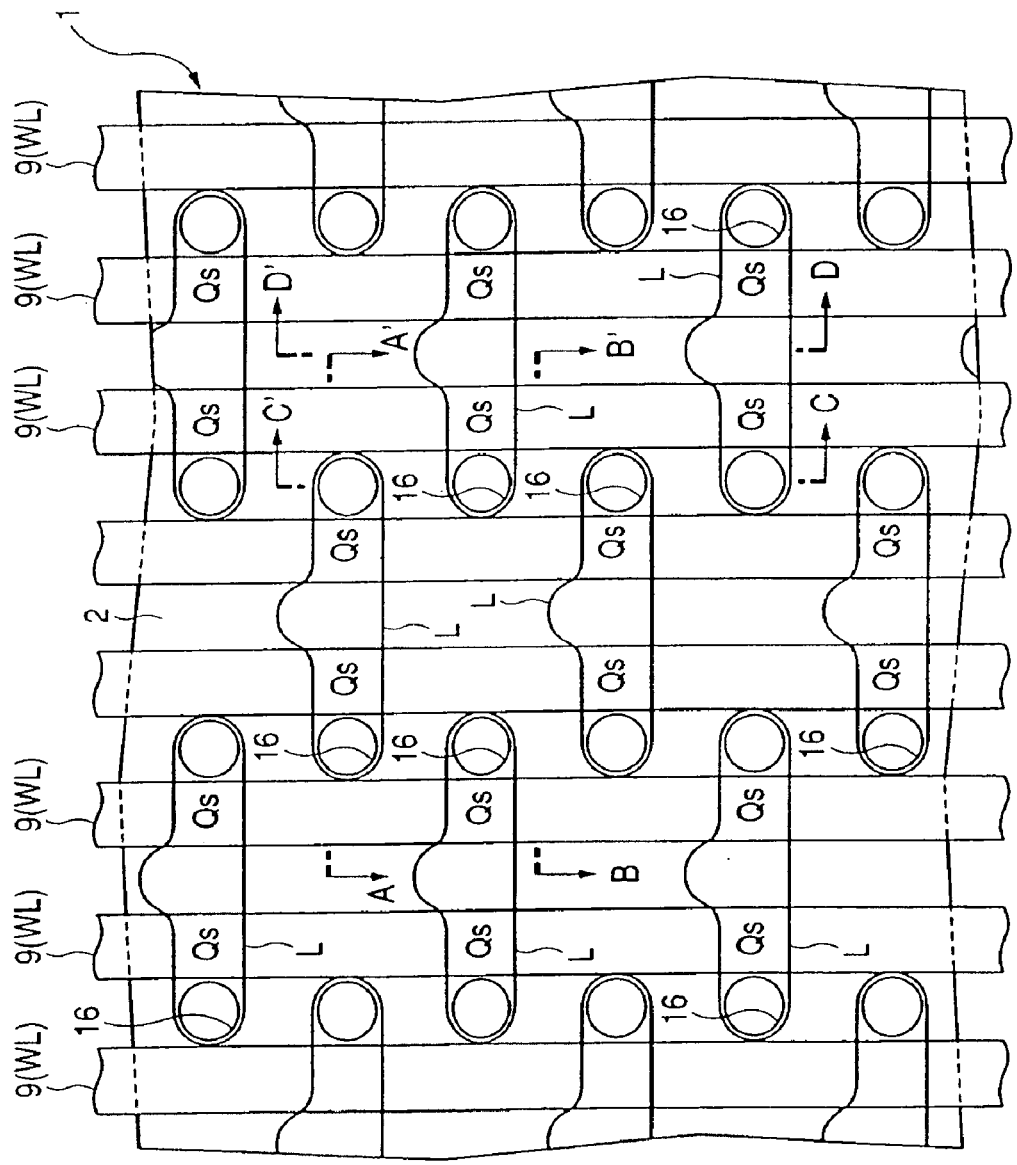
FIG. 9 is a plan view of an essential portion of a substrate showing the method of manufacturing a DRAM of embodiment 1 in accordance with the present invention.
Figure 10A:
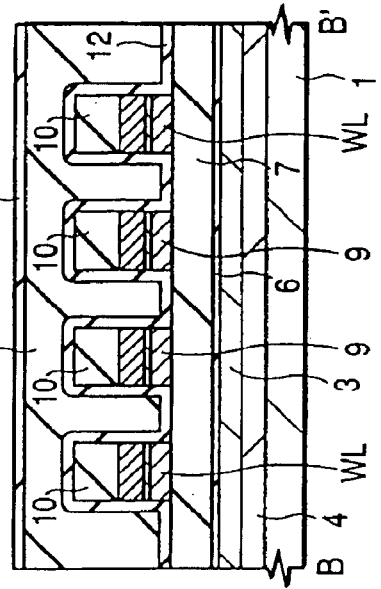
FIG. 10(A) through FIG. 10(D) are cross-sectional views showing a step of the method of manufacturing a DRAM of embodiment 1 in as seen along lines A–A'; B–B'; C–C' and D–D'; respectively, in FIG. 9.
Figure 10C:
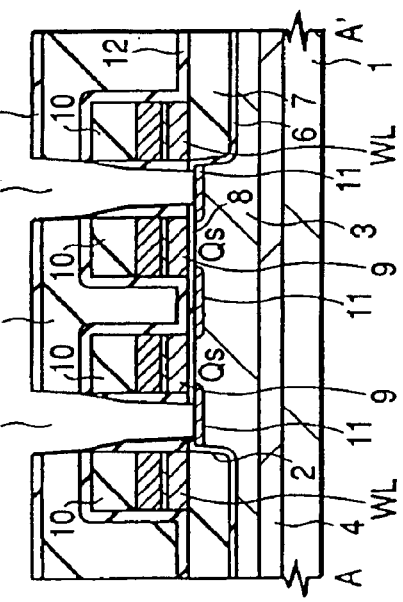
Figure 10B:
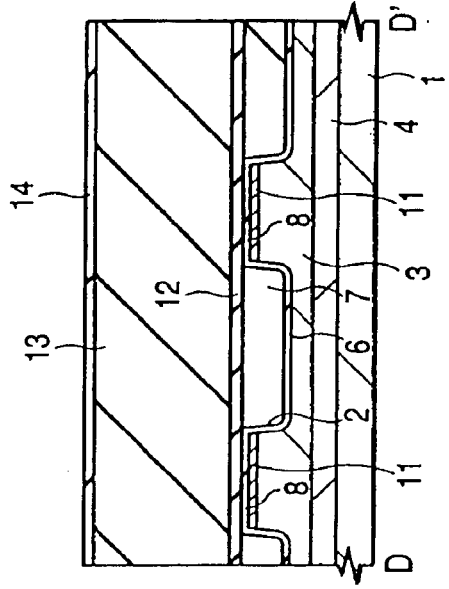
Figure 10D:
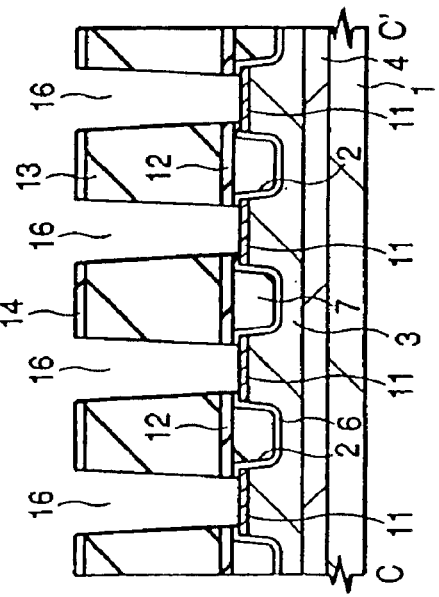
Figure 11A:
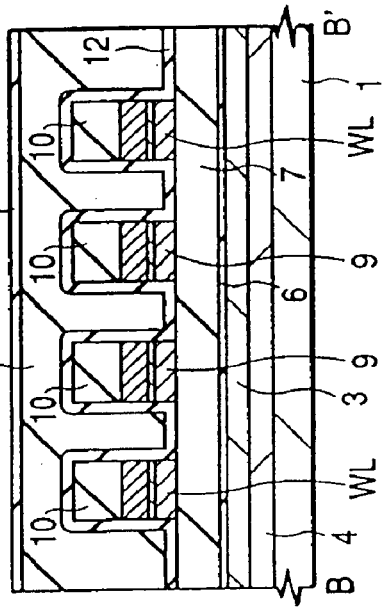
FIG. 11(A) through FIG. 11(D) are cross-sectional views showing a step of the method of manufacturing a DRAM of embodiment 1 as seen along lines A–A'; B-B'; C–C' and D–D'; respectively, in FIG. 9.
Figure 11C:
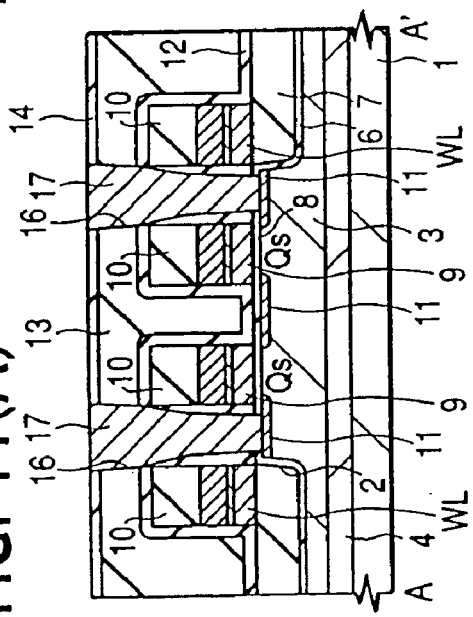
Figure 11B:
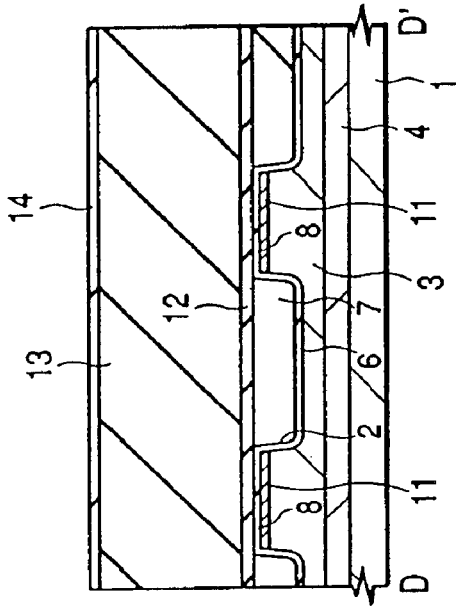
Figure 11D:
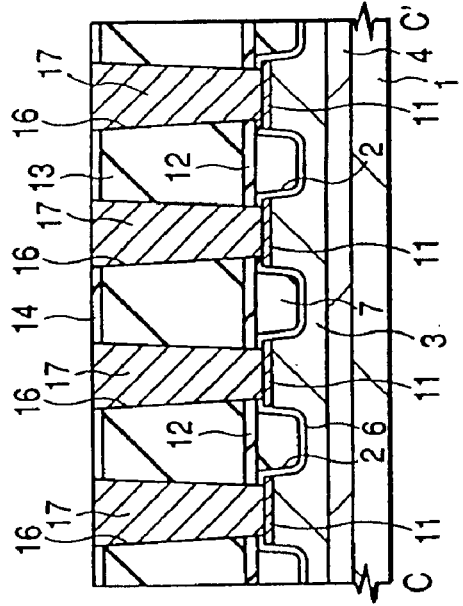
Figure 12A:
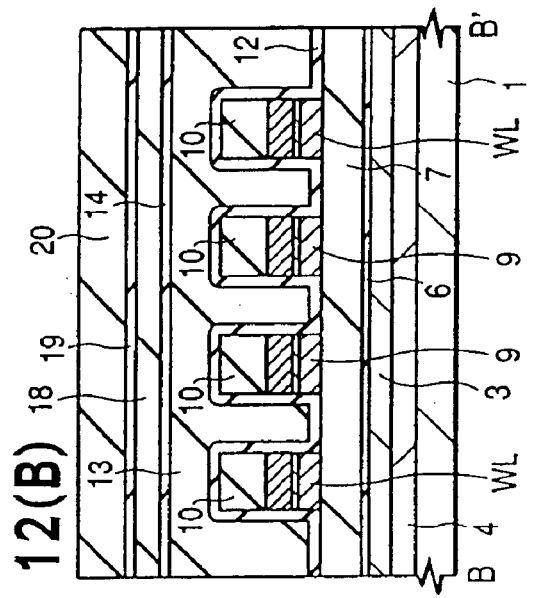
FIG. 12(A) through FIG. 12(D) are cross-sectional views showing a step of the method of manufacturing a DRAM of embodiment 1 as seen along lines A–A'; B-B'; C–C' and D–D'; respectively, in FIG. 9.
Figure 12B:
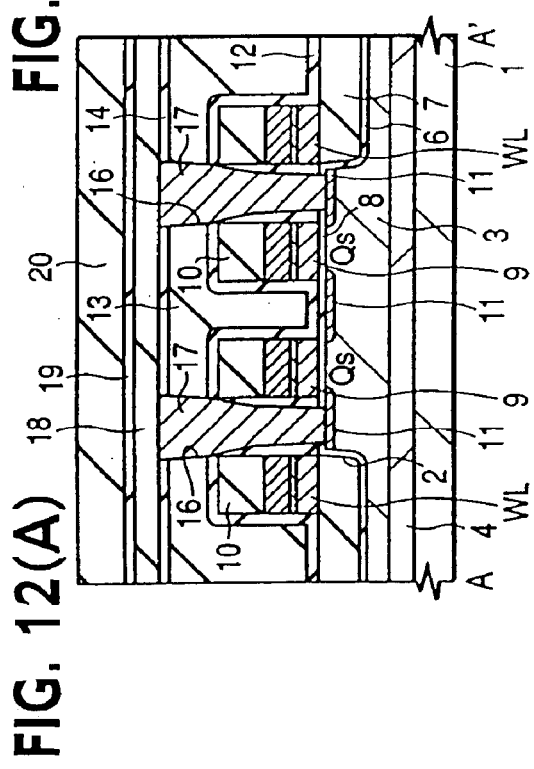
Figure 12C:
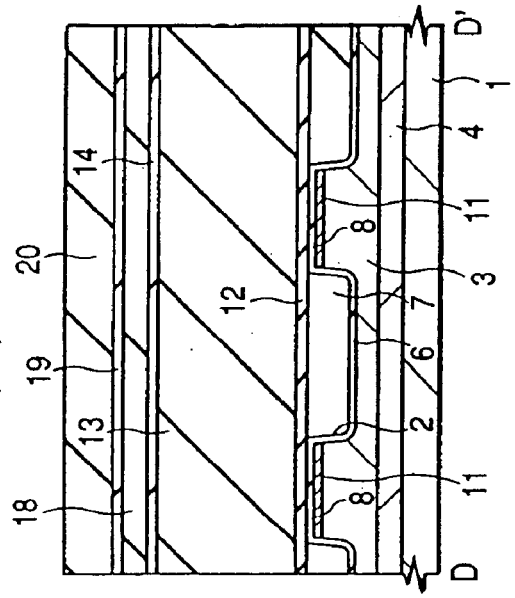
Figure 12D:
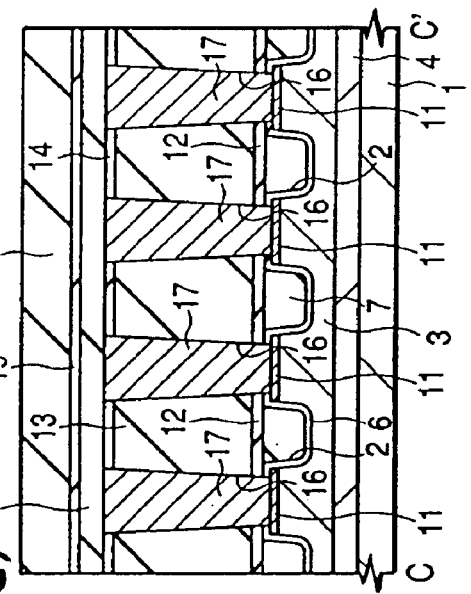
Figure 15:
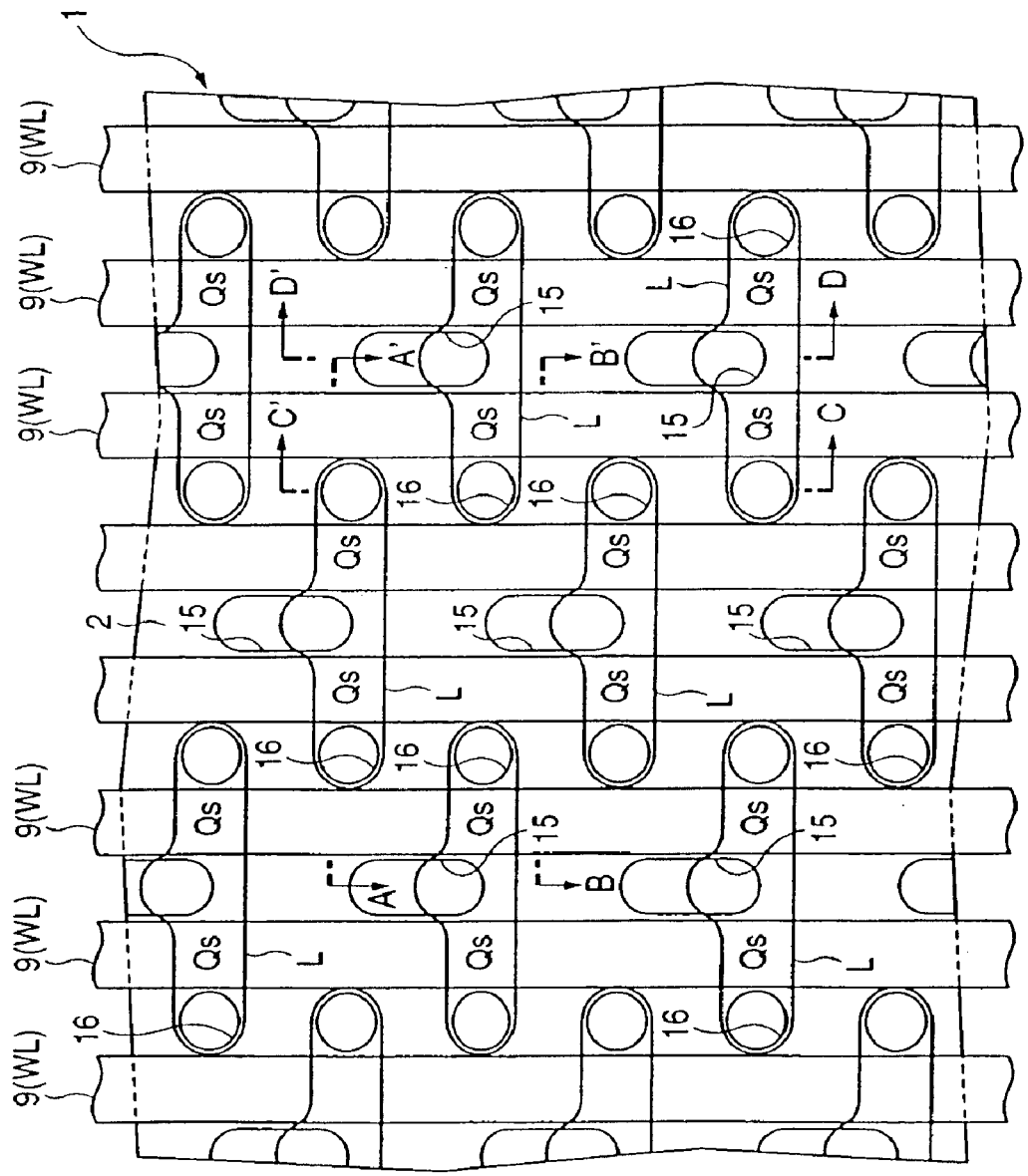
FIG. 15 is a plan view of an essential portion of a substrate showing the method of manufacturing a DRAM of embodiment 1 in accordance with the present invention.
Figure 16A:
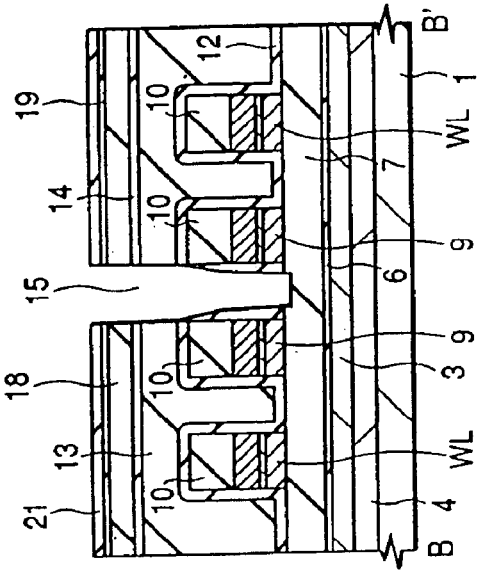
FIG. 16(A) through FIG. 16(D) are cross-sectional views showing a step of the method of manufacturing a DRAM of embodiment 1 as seen along lines A–A'; B-B'; C–C' and D–D'; respectively, in FIG. 15.
Figure 16C:
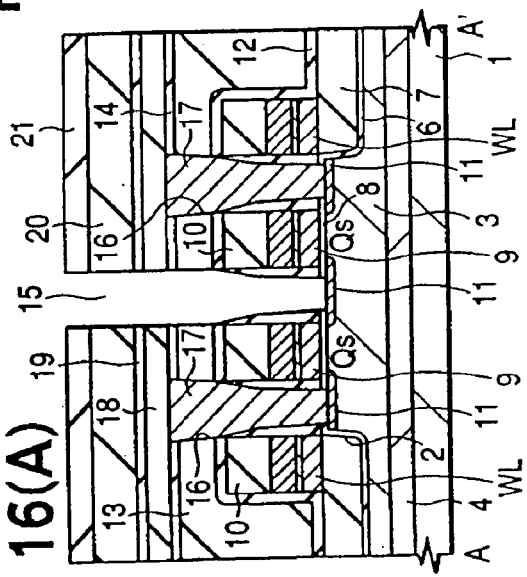
Figure 16B:
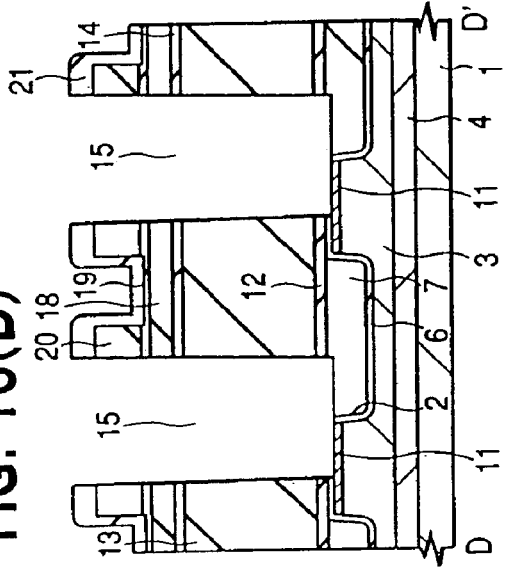
Figure 16D:
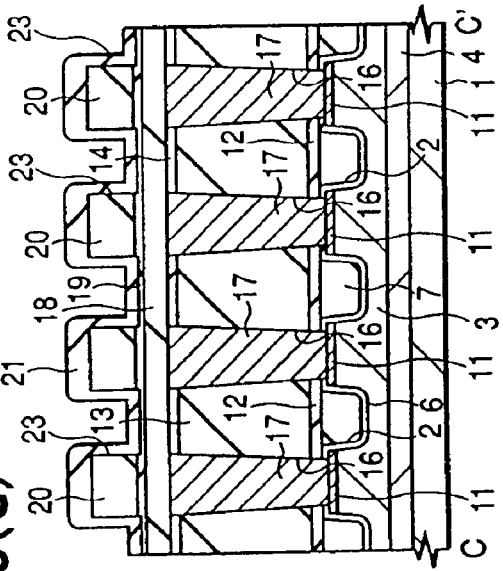
Figure 17A:
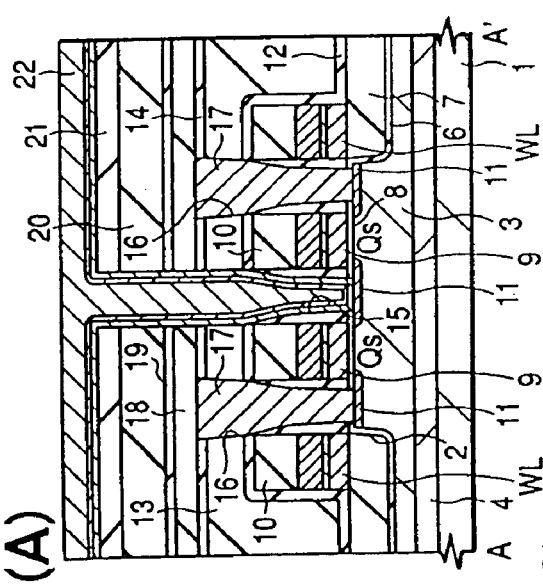
FIG. 17(A) through FIG. 17(D) are cross-sectional views showing a step of the method of manufacturing a DRAM of embodiment 1 as seen along lines A–A'; B-B'; C–C' and D–D'; respectively, in FIG. 15.
Figure 17B:
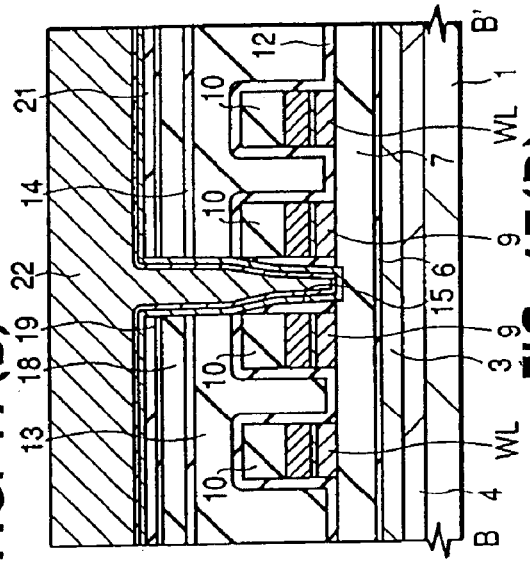
Figure 17C:
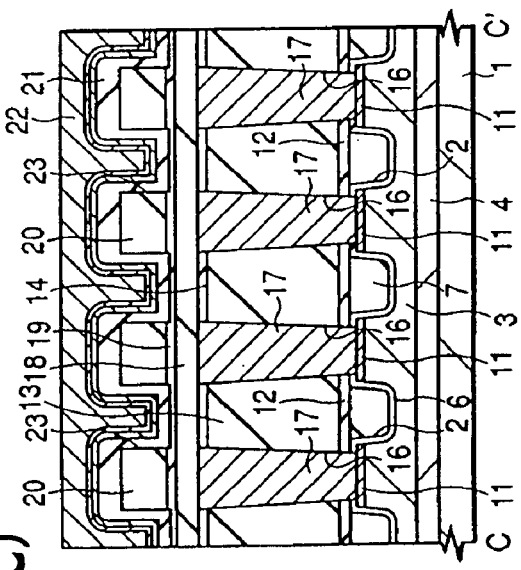
Figure 17D:
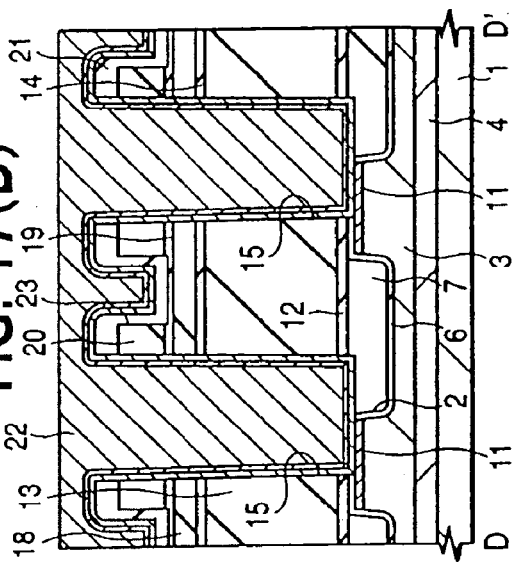

The preferred embodiments in accordance with the present invention will be described in detail on the basis of the drawings. In this respect, the same reference characters are used to identify parts having the same functions in all the drawings showing the preferred embodiments and a repeated description thereof will be omitted.

(Preferred Embodiment 1)

FIG. 1 is a plan view of an essential portion of a substrate showing a memory cell in the process of manufacturing a DRAM representing a preferred embodiment 1 in accordance with the present invention, and FIG. 2(A) through FIG. 2(D) are cross-sectional views of an essential portion of the substrate. In this connection, the FIG. 2(A) is a cross-sectional view taken on a line A-A' in FIG. 1. FIG. 2(B) is a cross-sectional view taken on a line B-B' in FIG. 1. FIG. 2(C) is a cross-sectional view taken on a line C–C' in FIG. 1, and FIG. 2(D) is a cross-sectional view taken on a line D-D' in FIG. 1.

On the main surface of a substrate 1 made of a p-type single crystal silicon, for example, there is formed a p-type well 3, and on the p-type well 3 there is formed active-regions L, the periphery of each of which is defined by a device isolating trench 2. As shown in FIG. 1, the active region L is formed in a plan pattern shaped as an inverted letter T, which is elongated from side to side in the drawing and extends upwards at the center in the drawing.

On each of the above-mentioned active regions L, there are formed two MISFETs (MISFETQses for selecting a memory cell) sharing one of a pair of source and drain (n-type semiconductor regions 11). The MISFETQs for selecting a memory cell is connected in series to a capacitance element C for storing information (not shown in FIG. 1) which is to be formed thereon in a later process to thereby constitute a memory cell of one bit of a DRAM.

The above-mentioned MISFETQs for selecting a memory cell is constituted mainly by a gate oxide film 8 formed on the surface of the substrate 1 (p-type well 3) of the active region L, a gate electrode 9 formed on the gate oxide film 8, and a pair of n-type semiconductor regions 11, 11 (source and drain) formed on the substrate 1 (p-type well 3) on both sides of the gate electrode 9.

The gate electrode 9 of the above-mentioned MISFETQs for selecting a memory cell is integrally formed with a word line WL and extends straight in the up-down direction in FIG. 1 with the same width and the same intervals. The width (gate length) and the interval of the gate electrode 9 (word line WL) are equal to the minimum size determined by the limit of resolution of photolithography.

The above-mentioned gate electrode 9 (word line WL) is constituted by a poly-metallic structure in which a barrier metal film, such as a WN (tungsten nitride) film or a TiN (titanium nitride) film, and a W (tungsten) film are laminated on the top of a polycrystalline silicon film doped with n-type impurities, such as P (phosphor), for example, and having a low resistance. Also, on top of the gate electrode 9 (word line WL) there is formed a silicon nitride film 10 having the same plan pattern as the gate electrode 9 (word line WL).

The device isolating trench 2 surrounding the substrate 1 (p-type well 3) of the above-mentioned active region L is constituted by a silicon oxide film 7 buried in the trench formed in the substrate 1 (p-well 3). The surface of the silicon oxide film 7 is planarized and is nearly as high as the surface of the substrate 1 (p-type well 3) of the active region L. Also, at the interface between the inside wall of the device isolating trench 2 and the silicon oxide film 7, there is formed a thin silicon oxide film 6 to reduce an interface state produced between the silicon oxide film 7 and the substrate 1 (p-type well 3) by a thermal oxidation method or the like.

On top of the above-mentioned MISFETQs for selecting a memory cell, there are formed a silicon nitride film 12 and two layers of silicon oxide films 13, 14. In the silicon nitride film 12 and the two silicon oxide films 13, 14 formed on one of the pair of source and drain (n-type semiconductor regions 11) of the MISFETQs for selecting a memory cell, a contact hole 16 is formed in which a plug 17 made of, for example, a polycrystalline silicon film having low resistance is buried. The capacitance element C for storing information to be formed in the later process is electrically connected to one of the pair of source and drain (n-type semiconductor regions 11) through the contact hole 16.

On the silicon oxide film 14, there are formed a silicon oxide film 18, a silicon nitride film 19 and a silicon oxide film 20, and in the silicon oxide film 20 there are formed wiring trenches 23 having a predetermined width and extending along the direction of the line B—B, at predetermined intervals. The width and the interval of the trench 23 are equal to the minimum size determined by the limit of resolution of photolithography.

In the wiring trench 23 along the inside wall thereof, there is formed a thin silicon oxide film 21 and further inside the silicon oxide film 21, there is formed a bit line BL. The bit line BL is electrically connected to the other of the pair of source and drain of the MISFETQs for selecting a memory cell (n-type semiconductor region 11 shared by two MISFETQses for selecting a memory cell) through a contact hole 15 made in the silicon oxide film 21 formed on the bottom of the bit line BL, the silicon nitride film 19 of a layer underlying the silicon oxide film 21, the silicon oxide films 18, 14, 13, and the silicon nitride film 12.

The bit lines BL are formed in three layers, for example, a Ti film (or Co film), a TiN film, and a W film, and extend straight with the same width and the same intervals in the right-left direction (in the direction of the line B-B') in FIG. 1, that is, along the direction which is at right angles to the word line WL. Since the bit line BL is formed inside the silicon oxide film 21 formed on the inside wall of the wiring trench 23 having a width equal to the minimum size determined by the limit of resolution of photolithography, its width is still smaller than the minimum size determined by the limit of resolution of the photolithography.

Next, a method of manufacturing the memory cell of a DRAM having the above-mentioned fine bit lines BL will be described in the order of process steps with reference to FIG. 3(A) to FIG. 23(B). In this connection, among these drawings, the plan views (FIG. 4, FIG. 6, FIG. 9, FIG. 15) show only the plan pattern of the active regions L, the gate electrodes 9 (word lines WL), the bit lines BL, and the connection holes (contact holes, through holes) and omit the insulating films (silicon oxide films, silicon nitride films) and the plugs buried in the connecting holes. Further, in the following description, there will be described a manufacturing process using a design rule of 0.18 $\mu$m, though it is not intended to limit the manufacturing process to this value.

First, as shown in FIG. 3(A) through FIG. 3(D), device isolating trenches 2 are formed in a substrate 1 made of p-type single crystal silicon having a low specific resistance of, for example, about from 1 Ωcm to 10 Ωcm. In order to form the device isolating trench 2, first, the substrate 1 to be a device isolating region is etched away to form a trench having a depth of about 350 nm and then is subjected to a thermal oxidation treatment at about 850° C. to 1000° C. to form a thin silicon oxide film 6 having a thickness of about 10 nm on the inside wall of the trench. The silicon oxide film 6 is formed to recover the damage of dry-etching produced in the inside wall of the trench and to reduce an interface state generated at the interface between a silicon oxide film 7 to be buried in the trench in the following process and the substrate 1. In this connection, when the trench is formed, if the composition of a gas etching the substrate 1 (for example, $CF_4+O_2$) is adjusted and the side walls of the trench are tapered at about 80 degrees, the silicon oxide film 7 to be deposited in the following process is easily buried in the trench.

Next, on the substrate 1, including the inside of the trench, there is deposited the silicon oxide film 7 having a thickness of about 450 nm to 500 nm by a CVD method and then the substrate 1 is subjected to thermal oxidation treatment at about 1000° C. to densify the silicon oxide film 7 to improve the quality of the silicon oxide film 7 and then the silicon-oxide film 6 on the trench is polished by a chemical mechanical polishing method (CMP method) to planarize the surface of the silicon oxide film 6.

By forming the device isolating trenches 2 in the substrate 1 by the above-mentioned method, as shown in FIG. 4, there are formed many active regions L surrounded by the device isolating trenches 2 and interspersed like islands. Each of these active regions L has a shape like a rectangle having long sides elongated in the direction in which the bit line extends and around corners, and having a projecting portion at the center in the direction in which the bit line extends. The size along the line C–C' of the active region L and the interval between the neighboring active regions L are the minimum size (0.18 μm) determined by the limit of resolution of the photolithography and the size along the line A-A' is 0.9 μm.

Next, as shown in FIG. 5(A) through FIG. 5(D), p-type impurity ions (boron) and n-type impurity ions (for example, phosphorus) are implanted into the substrate 1 and then the substrate is subjected to a heat treatment at about 950° C. to diffuse the impurities to form a p-type well 3 and a n-type well 4. The n-type well 4 under the p-type well 3 is formed to prevent noises from entering the p-type well 3 through the substrate 1.

Then, the surface of the substrate 1 is cleaned by wet-etching using a hydrofluoric acid and then the substrate 1 is subjected to thermal oxidation treatment at about 800° C. to 850° C. to form a clean gate oxide film 8 having a thickness of about 7 nm on the surface thereof In this connection, a part of the gate oxide film 8 may be constituted by a silicon oxide nitride film containing silicon nitride therein. Since the silicon oxide nitride film has the improved effects of preventing the generation of an interface state in the film and reducing an electron trap as compared with the silicon oxide film, it can improve the hot carrier resistance of the gate oxide film 8. In order to form the silicon oxide nitride film, it is recommended that the substrate 1 be subjected to thermal oxidation treatment in an atmosphere containing a nitrogen gas such as a NO gas and a $NO_2$ gas.

Next, as shown in FIG. 6, and FIG. 7(A) through FIG. 7(D), on the top of the gate oxide film 8, there are formed gate electrodes 9 (word lines WL) and then n-type impurity ions (phosphorus or arsenic) are implanted into the substrate 1 (p-type well 3) at both sides of each of the gate electrodes 9 to form n-type semiconductor regions 11 (source and drain), thereby forming MISFETQses for selecting a memory cell.

The gate electrode 9 (word line WL) is formed, for example, by depositing on the gate oxide film 8 a polycrystalline silicon film doped with P (phosphorus) and having a thickness of about 70 nm and a low resistance by a CVD method and then by depositing thereon a WN film having a thickness of about 50 nm and a W film having a thickness of about 100 nm by a sputtering method and further by depositing thereon a silicon nitride film 10 by the CVD method and still further by dry-etching these films by using a photoresist film (not shown) as a mask to pattern these films. The width (gate length) of the gate electrode 9 (word line WL) and the interval between the neighboring gate electrodes 9 are made the minimum size (0.18 μm) determined by the limit of resolution of the photolithography.

Next, as shown in FIG. 8(A) through FIG. 8(D), a silicon nitride film 12 having a thickness of about 50 nm to 100 nm is deposited on the substrate 1 by the CVD method, and then on the silicon nitride film 12, there is formed a silicon oxide film 13 having a thickness of about 700 nm to 800 nm by the CVD method, and then the silicon oxide film 13 is polished by the CMP method, whereby the surface thereof is planarized. Or, it is also recommended that a SOG (spin on glass) film (not shown) having a thickness of about 300 nm be applied to the substrate 1 and that the substrate 1 be then subjected to the heat treatment at about 800° C. to densify the SOG film and that a silicon oxide film 13 having a thickness of about 500 nm to 600 nm be then deposited on the SOG film by the CVD method and that the silicon oxide film 13 be then polished by the CMP method to planarize the surface thereof. Since the SOG film has a better performance in filling a gap between fine wirings as compared with the silicon oxide film deposited by the CVD method, the gap between the gate electrodes 9 (word lines WL) finely patterned to the minimum size determined by the limit of resolution of the photolithography can be well filled with the SOG film.

Then, on the silicon oxide film 13, there is deposited a thin silicon oxide film 14 having a thickness of about 100 nm by the CVD method. The silicon oxide film 14 is deposited to repair fine defects produced on the surface of the silicon oxide film 13 when it is polished by the CMP method.

Next, as shown in FIG. 9, and FIG. 10(A) through FIG. 10(D), the silicon oxide films 14, 13 are dry-etched by using a photoresist film (not shown) as a mask and then the silicon nitride film 12 is dry-etched to form a contact hole 16 above one of the n-type semiconductor regions 11 (source and drain) of the MISFETQS for selecting a memory cell.

The silicon oxide films 14, 13 are etched under the conditions where the etching rate of a silicon oxide to a silicon nitride is made large to prevent the silicon nitride film 12 from being completely removed.

Also, the silicon nitride film 12 is etched under the conditions where the etching rate of the silicon nitride to silicon and the silicon oxide is made large to prevent the substrate 1 from being deeply etched and the silicon nitride film 12 is etched to the minimum essential amount of etching to prevent the silicon oxide film 7 from being deeply etched. Further, the silicon nitride film 12 is etched anisotropically to leave the silicon nitride film 12 on the side wall of the gate electrode 9 (word line WL). This enables the contact hole 16, having a diameter finer than the minimum size determined by the limit of resolution of the photolithography, to be formed in a self-alignment manner with respect to the gate electrode 9 (word line WL).

Then, as shown in FIG. 11(A) through FIG. 11(D), in the contact hole 16, there is formed a plug 17. The plug 17 is formed by depositing a polycrystalline silicon film doped with n-type impurities such as P (phosphorus) and having low resistance on the silicon oxide film 14 including the inside of the contact hole 16 by the CVD method and then by etching back the polycrystalline silicon film (or by polishing it by the CMP method) to leave it only inside the contact hole 16.

Then, as shown in FIG. 12(A) through FIG. 12(D), on the silicon oxide film 14, there are sequentially formed a silicon oxide film 18 having a thickness of about 100 nm to 200 nm, a silicon nitride film 19 having a thickness of about 20 nm, and a silicon oxide film 20 having a thickness of about 300 nm by the CVD method. The silicon oxide film 18 on the silicon oxide film 14 is formed to prevent leakage from being produced between the plug 17 buried in the contact hole 16 made in the layer below the silicon oxide film 18 and a bit line BL to be formed on the silicon nitride film 19 in a later process. Also, the silicon nitride film 19 is used as an etching stopper when the silicon oxide film 20 to be formed on the silicon nitride film 19 is etched in a following process to form wiring trenches 23. The silicon nitride film 19 is also used as an etching stopper when a through hole 28 for connecting a capacitance element C for storing information formed on the bit line in the later process to the above-mentioned contact hole 16.

Then, as shown in FIG. 13(A) and FIG. 13(D), by dry-etching the silicon oxide film 20 by using a photoresist film (not shown) as a mask, there are formed a plurality of wiring trenches 23 extending along the line B-B' in a predetermined width at predetermined intervals. The width and the interval in the direction of a line C–C' (a line D-D') of these writing trenches 23 formed in the silicon oxide film 20 are made the minimum size determined by the limit of resolution of the photolithography; in other words, the width and the interval of the wiring trench 23 are equal to the width and the interval of the word line WL. The trenches 23 are formed in the region where the bit lines BL shown in FIG. 1 are formed.

The silicon oxide film 20 is etched by using the underlying silicon nitride film 19 as an etching stopper. In other words, the silicon oxide film 20 is etched under the conditions where the etching of the silicon oxide to the silicon nitride is made large to prevent the silicon nitride film 19 from being completely removed. This eliminates the need for over-etching the silicon oxide film 20 to reduce the variations in the film thickness of the silicon oxide film 20 in a wafer surface when the silicon oxide film 20 is etched to form the wiring trenches 23, which can reduce the thickness of the underlying silicon oxide film 18 and in turn can reduce the level of the region (memory array) where a memory cell on the main surface of the substrate 1 is formed.

Then, as shown in FIG. 14(A) through FIG. 14(D), on the silicon oxide film 20 including the inside of the wiring trench 23, there is deposited a silicon oxide film 21 by the CVD method. In this process, the thickness (t) of the silicon oxide film 21 is made thinner than half the width (w) of the wiring trench 23 (t<w/2) to make a gap inside the silicon oxide film 21 deposited on the inside wall of the wiring trench 23.

Then, as shown in FIG. 15, and FIG. 16(A) through FIG. 16(D), by sequentially dry-etching the silicon oxide films 21, 20, the silicon nitride film 19, the silicon oxide films 18, 14, 13, and the silicon nitride film 12 by using a photoresist film (not shown) as a mask, on the top of the other of the n-type semiconductor regions 11 (source and drain) of the MISFETQs for selecting-a memory cell (n-type semiconductor regions 11 shared by two MISFETQses for selecting a memory cell) there is formed a contact hole 15.

The above-mentioned etching process is performed by combining the condition where the etching rate of the silicon oxide to the silicon nitride is made large with the condition where the etching rate of the silicon nitride to silicon is made large, as is the case with the etching process for forming the above-mentioned contact hole 16, whereby the contact hole 15 having a fine diameter smaller than the minimum size determined by the limit of resolution of the photolithography can be formed in a self-alignment manner to the gate electrode 9 (word line WL).

Also, in order to ensure a sufficient contact area between the bit line BL to be formed inside the contact hole 15 in the following process and the n-type semiconductor region 11, the contact hole 15 is formed in a rectangular plan pattern whose diameter is larger in the direction of a line D-D' than in the direction of a line A-A' (a line B-B') and is arranged so that it overlaps the projecting portion of the active region L; that is, forming the projecting portion of the active region L makes it possible to ensure a sufficient contact area between the bit line BL and the n-type semiconductor region 11 and to ensure a short margin between the n-type semiconductor region 11 and the neighboring bit lines BL.

Then, as shown in FIG. 17(A) through FIG. 17(D), in the contact hole 15 and on the top of the silicon oxide film 21, including the inside of each of the wiring trenches 23, there is deposited a metal film 22 to be the material of the bit line BL. The metal film 22 is constituted, for example, by a Ti film (or a Co film) having a thickness of about 40 nm, deposited by the sputtering method, and a TiN film having a thickness of about 30 nm and a W film having a thickness of about 300 nm, which are deposited by the CVD method. In this connection, the metal film 22 may be formed of a W film deposited by the CVD method or a laminated film of the W film and the TiN film. Also, the metal film 22 may be formed of a metal film having a high melting point other than the W film (for example, a Mo film, a Ta film), a metal nitride film having a high melting point, or a laminated film of these films.

Then, by polishing the metal film 22 and the silicon oxide film 21 on the top of the silicon oxide film 20 until the surface of the silicon oxide film 20 is exposed by the CMP method, as shown in FIG. 1, FIG. 2(A), and FIG. 2(C), bit lines BL are formed in the contact holes 15 and in the wiring trenches 23.

Since the bit line BL is formed in this way in the wiring trench 23 having a width equal to the minimum size determined by the limit of resolution of the photolithography with the silicon oxide film 21 therebetween, its width is made smaller than the minimum size determined by the limit of resolution of the photolithography. Accordingly, even if the memory cell is reduced in size, this enables an alignment margin to be ensured between a through hole 28 to be formed between the bit lines BL in a later process and the bit lines BL to surely prevent a short circuit from occurring between a plug 29 to be buried in the through hole 28 and the bit line BL.

The bit line BL is formed in the wiring trench 23 formed in the silicon oxide film 20 and is planarized so that its surface is at the same level as the surface of the silicon oxide film 20. Also, as the bit line BL is formed in the silicon oxide film 21 deposited on the inside wall of the wiring trench 23, its width is regulated by the thickness of the silicon oxide film 21; that is, the sizes of the bit line BL (width and thickness) are controlled by controlling the thicknesses of the silicon oxide films 20, 21.

The control of the thicknesses of the silicon oxide films 20, 21 by the CVD method can reduce a variation in film thickness as compared with the control thereof using a method of patterning a photoresist film finely by an isotropic etching. Accordingly, the method in accordance with the present preferred embodiment for controlling the sizes of the bit line BL by controlling the thicknesses of the silicon oxide films 20, 21 can reduce a variation in the size of the bit line BL as compared with the case in which the material of the bit line (metal film 22) is patterned by the use of a photoresist film whose width is finely patterned by the isotropic etching. In other words, the method in accordance with the present preferred embodiment for forming the bit line can form bit lines which are finer than the minimum size determined by the limit of resolution of the photolithography with high accuracy.

Also, according to the method in accordance with the present preferred embodiment for forming the bit line, since the interval between the neighboring bit lines BL is made larger than the width of the bit line BL, it is possible to reduce the parasitic capacitance of the b line BL as compared with the case in which the width of the bit line BL and the interval between the neighboring bit lines BL are made the minimum size determined by the limit of resolution of the lithography.

Then, as shown in FIG. 18(A) through FIG. 18(D), on top of the bit lines BL, there are sequentially formed a silicon oxide film 24 having a thickness of about 300 nm to 400 nm and a polycrystalline silicon film 25 having a thickness of about 200 nm by the CVD method. Then, in the polycrystalline silicon film 25 above the contact hole 16, there is formed a through hole 26 by dry-etching using a photoresist film (not shown) as a mask. The diameter of the through hole 26 is made the minimum size determined by the limit of resolution of the-photolithography.

The silicon oxide film 24 deposited on top of the bit line BL is an insulating film separating the bit line BL from the lower electrode 33 of a capacitance element C for storing information to be formed in a later process. In the present preferred embodiment for forming the bit line BL in the wiring trench 23 formed in the silicon oxide film 20, the surface of the silicon oxide film 20 is at the same level as the surface of the bit line BL and hence the surface of the silicon oxide film 24 deposited on top of the bit line BL is planarized. Accordingly, the method for forming the bit line in accordance with the preferred embodiment eliminates the need for a process of planarizing the silicon oxide film 24 deposited on top of the bit line BL by the CMP method and can shorten the manufacturing process for producing a DRAM. Further, the method can reduce the thickness of the silicon oxide film 24 and hence can reduce the height of a memory array.

Then, as shown in FIG. 19(A) through FIG. 19(D), on the side wall of the through hole 26, there is formed a side wall spacer 27. The side wall spacer 27 is formed by depositing a second thin polycrystalline silicon film having a thickness of about 60 nm on top of the polycrystalline silicon film 25 including the inside of the through hole 26 by the CVD method and then by anisotropically dry-etching the second polycrystalline silicon film to leave the second polycrystalline silicon film on the side wall of the through hole 26. Forming the side wall spacer 27 makes the substantial diameter of the through hole 26 smaller than the minimum size determined by the limit of resolution of the photolithography.

Next, as shown in FIG. 20(A) through FIG. 20(D), by dry-etching the silicon oxide film 24 at the bottom of the through hole 26, the silicon oxide film 20, the silicon nitride film 19, and the silicon oxide film 18 by using the polycrystalline silicon film 25 and the side wall spacer 27 as masks, a through hole 28 reaching the contact hole 16 is formed between the neighboring bit lines BL. Since the through hole 28 is formed in a self-alignment manner to the through hole 26 of the minimum size determined by the limit of resolution of the photolithography, that is, in a diameter regulated by the side wall spacer 27, the diameter of the through hole 28 is smaller than the minimum size. Accordingly, even if the memory cell is reduced in size, this enables an alignment margin between the bit line BL and the through hole 28 to be ensured to surely prevent a short circuit from occurring between a plug 29 to be buried in the through hole 28 in the following process and the bit line BL.

Also, when the through hole 28 is formed, the silicon oxide films 24, 20 are first etched away by using the silicon nitride film 19 as an etching stopper and then the silicon nitride film 19 is etched away and then the silicon oxide film 18 is etched away. In this manner, when the deep through hole 28 extending from the surface of the silicon oxide film 24 to the surface of the plug 17 in the contact hole 16 is formed, if the etching is stopped in the middle of the process (at the surface of the silicon nitride film 19), it is possible to prevent the underlying silicon oxide films 14, 13 from being etched deeply to a defective extent even if the through hole 28 is not aligned with the contact hole 16 below the through hole 28. This eliminates the need for an alignment margin between the through hole 28 and the contact hole 16 and can easily reduce the size of the memory cell.

Figures 21A, 21B:
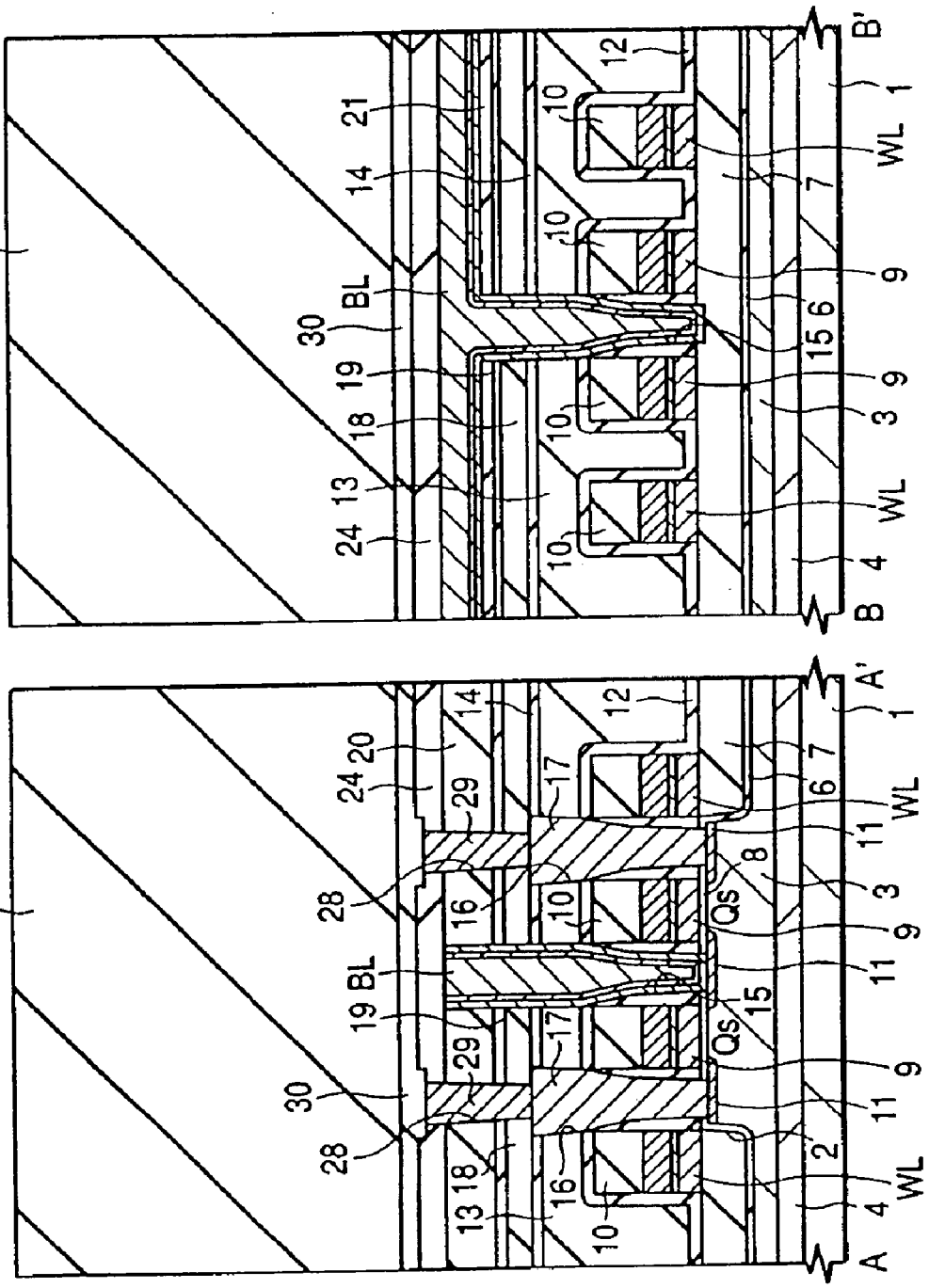
FIGS. 21(A) and 21(B) are a cross-sectional views showing a step of the method of manufacturing a DRAM of embodiment 1 as seen along lines A–A'; B-B'; C–C' and D–D'; respectively, in FIG. 15.

Next, as shown in FIGS. 21(A) and 21(B), in the through hole 28, there is formed a plug 29, and then on top of the silicon oxide film 24, there are sequentially formed a silicon nitride film 30 having a thickness of about 200 nm and a thick silicon oxide film 31 having a thickness of about 1.3 $\mu$m by the CVD method. The plug 29 is formed by depositing a polycrystalline silicon film doped with n-type impurities such as P (phosphorus) and having low resistance on top of the silicon oxide film 24 including the inside of the through hole 28 by the CVD method and then by etching back the polycrystalline silicon film (or polishing it by the CMP method) to leave the polycrystalline silicon film only in the through hole 28. In this connection, the silicon nitride film 30 and the silicon oxide film 24 underlying the silicon nitride film 30 may be constituted only by the single layer of the silicon nitride film 30.

Next, as shown in FIGS. 22(A) and 22(B), above the through hole 28, there is formed a trench 32 by sequentially dry-etching the silicon oxide film 31 and the silicon nitride film 30 underlying the silicon oxide film 31 by using a photoresist film (not shown) as a mask. Then the deep trench 32 extending from the surface of the silicon oxide film 31 to the surface of the plug 29 in the through hole 28 is formed, if the etching is once stopped at the surface of the silicon nitride film 30 and then the silicon nitride film 30 is etched, it is possible to prevent the underlying silicon oxide film 24 from being etched deeply to a defective extent.

Next, on top of the silicon oxide film 31 including the inside of the trench 32, there is deposited a polycrystalline silicon film doped with n-type impurities such as P (phosphorus) and having low resistance and having a thickness of about 50 nm by the CVD method, and then a photoresist film or the like is buried in the trench 32 and the polycrystalline silicon film on the top of the silicon oxide film 31 is etched back to leave the polycrystalline silicon film only on the inside wall of the trench 32, whereby the lower electrode 33 of the capacitance element C for storing information is formed along the inside wall of the trench 32.

Figure 23A:
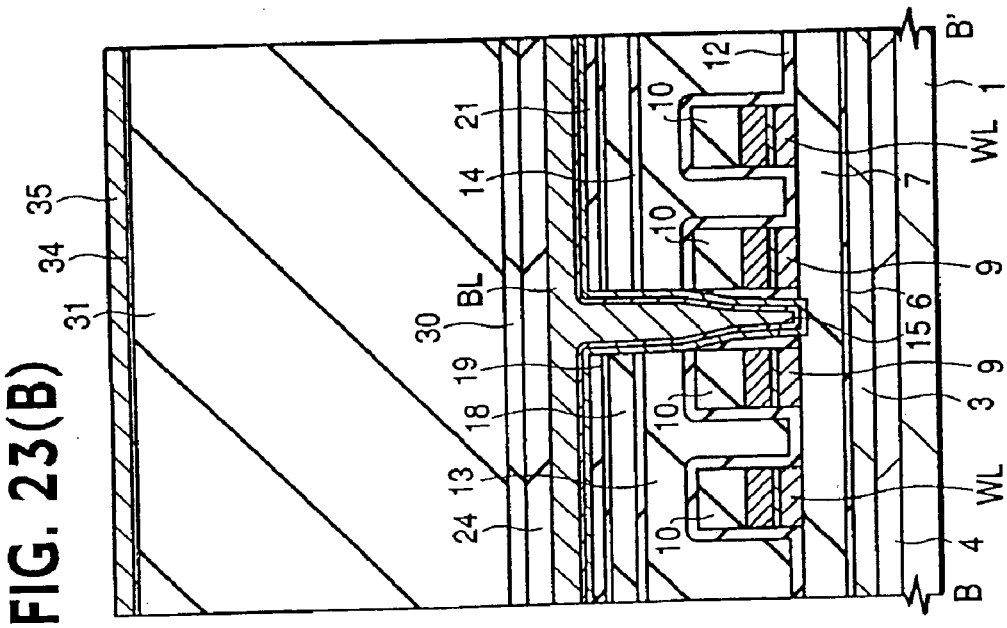
FIGS. 23(A) and 23(B) are a cross-sectional views showing a step of the method of manufacturing a DRAM of embodiment 1 as seen along lines A–A'; B-B'; C–C' and D–D'; respectively, in FIG. 15.
Figure 23B:
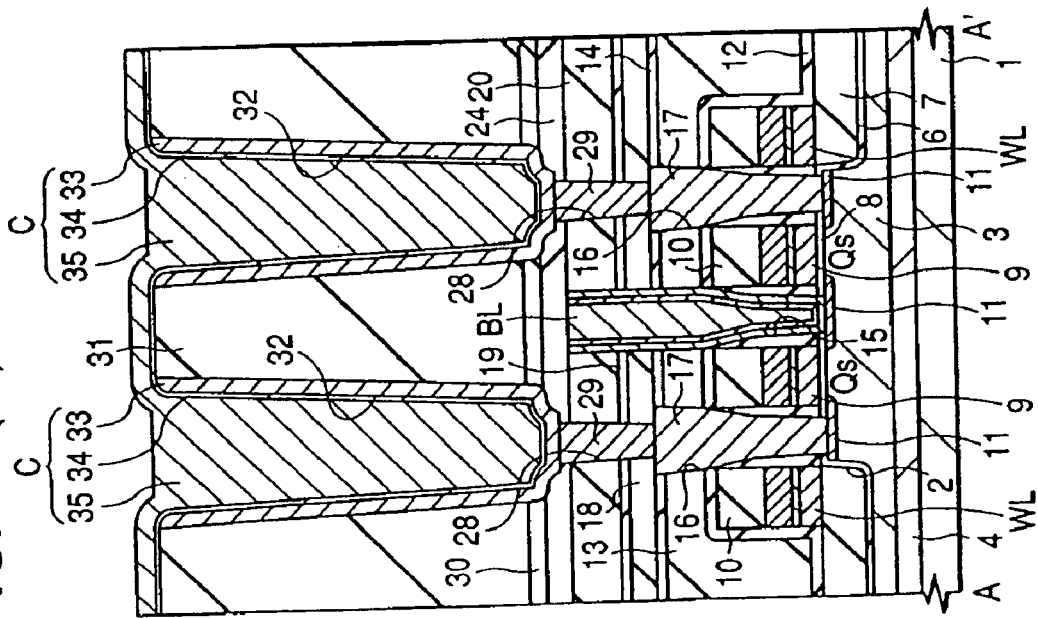
Figure 24A:
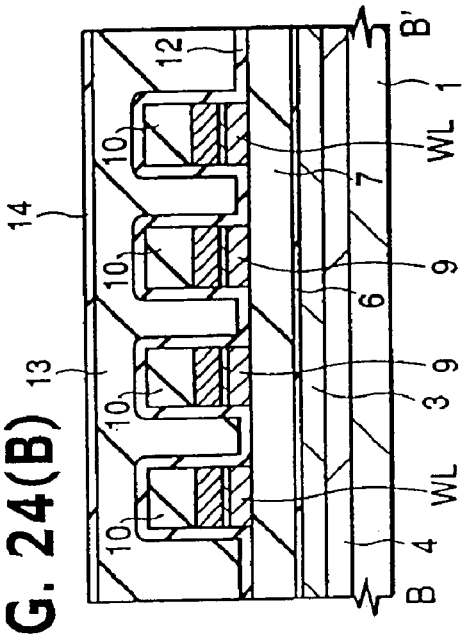
FIG. 24(A) through FIG. 24(D) are cross-sectional views showing a step of the method of manufacturing a DRAM of embodiment 2 as seen along lines A–A'; B-B'; C–C' and D–D'; respectively, in FIG. 1.
Figure 24B:
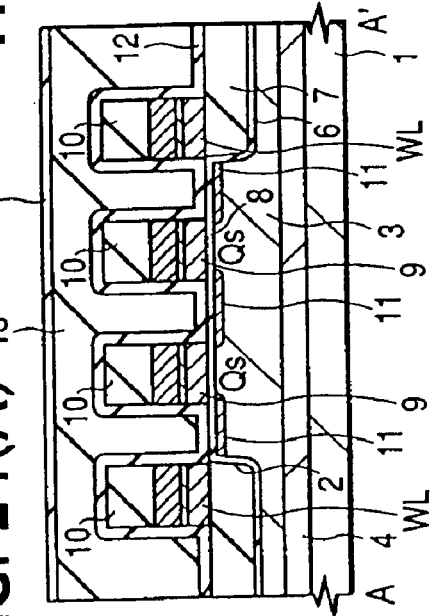
Figure 24C:
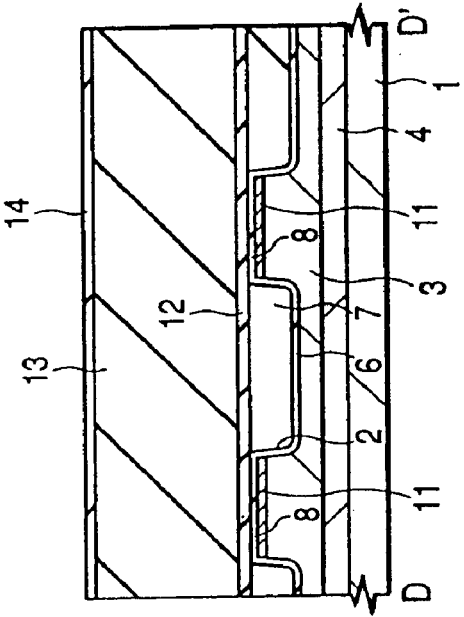
Figure 24D:
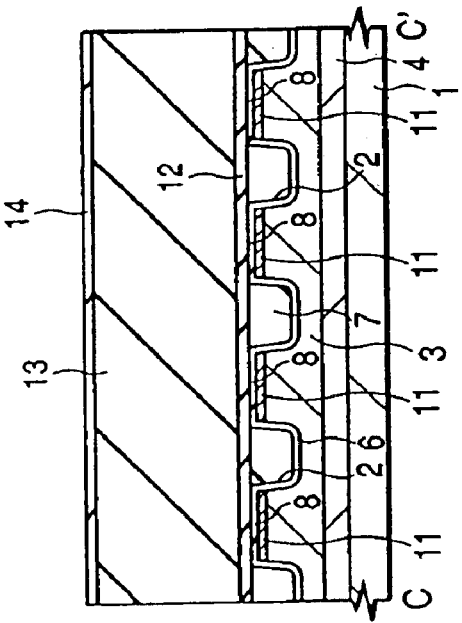
Figure 25A:
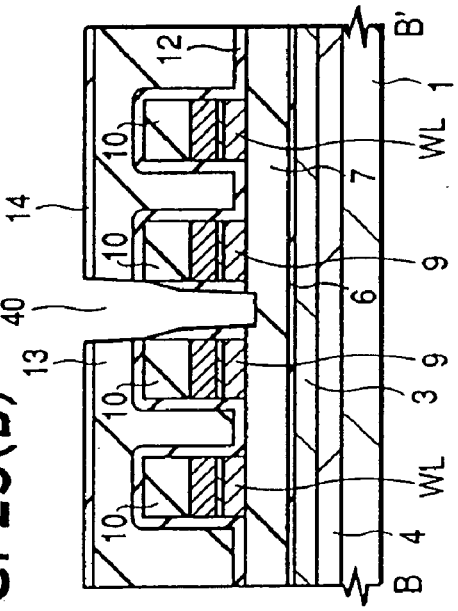
FIG. 25(A) through FIG. 25(D) are cross-sectional views showing a step of the method of manufacturing a DRAM of embodiment 2 as seen along lines A–A'; B-B'; C–C' and D–D'; respectively, in FIG. 1.
Figure 25B:
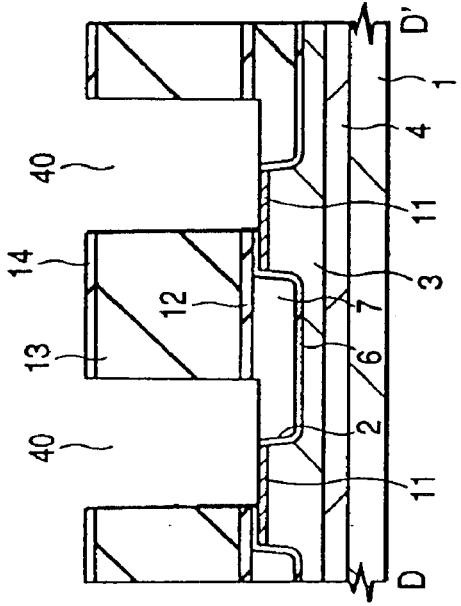
Figure 25C:
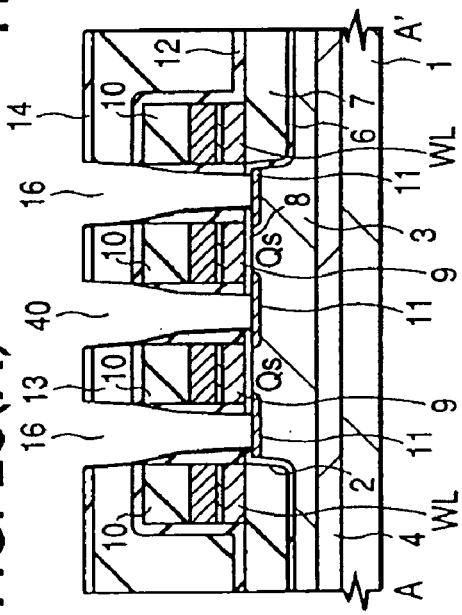
Figure 25D:
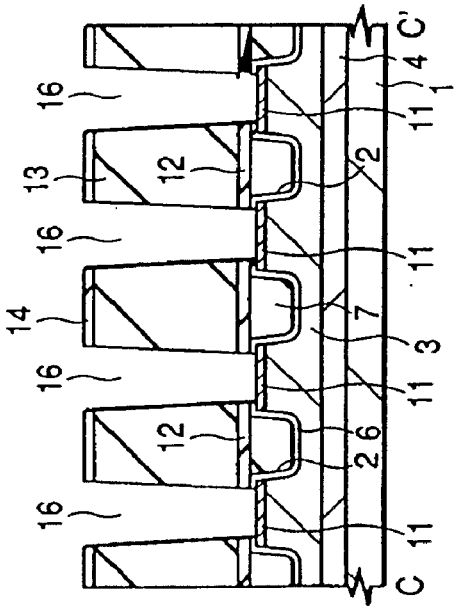
Figure 27B:
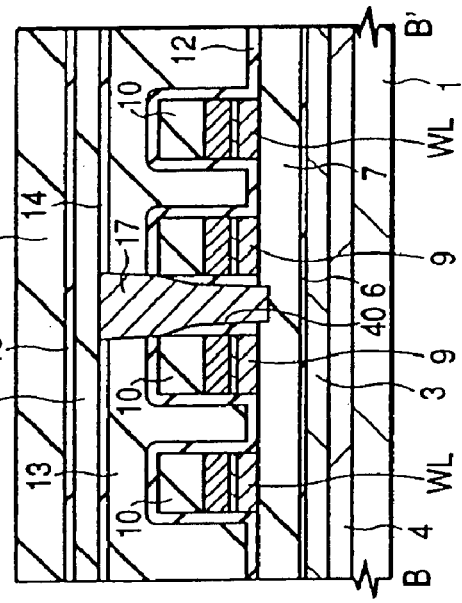
FIG. 27(A) through FIG. 27(D) are cross-sectional views showing a step of the method of manufacturing a DRAM of embodiment 2 as seen along lines A–A'; B–B'; and D–D'; respectively in FIG. 1.
Figure 27A:
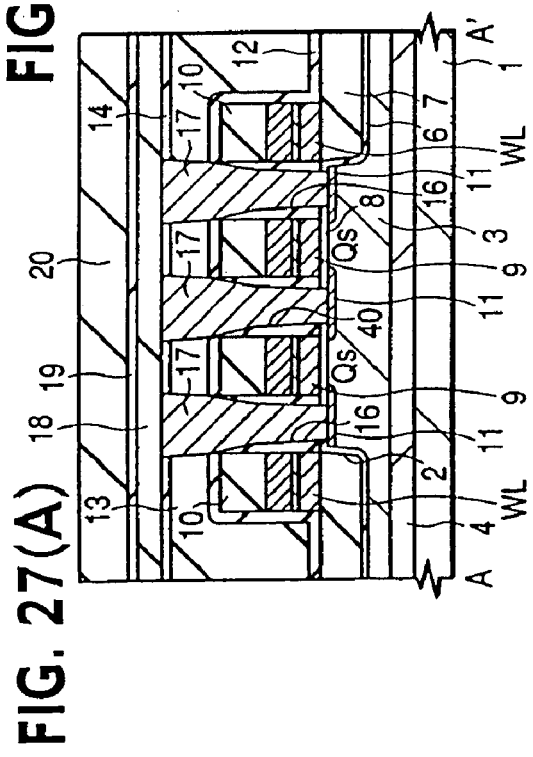
Figure 27D:
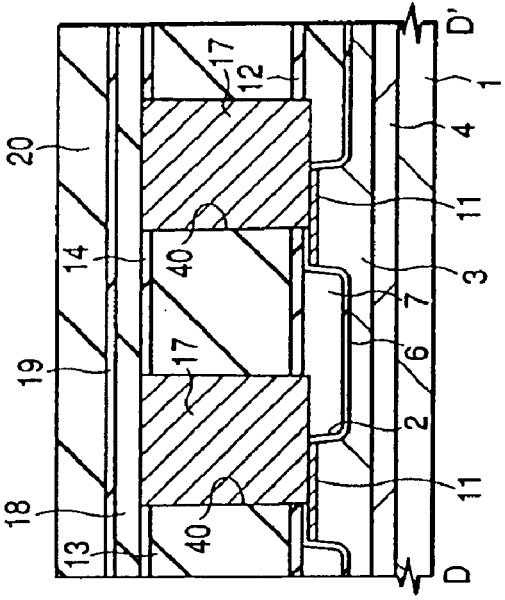
Figure 27C:
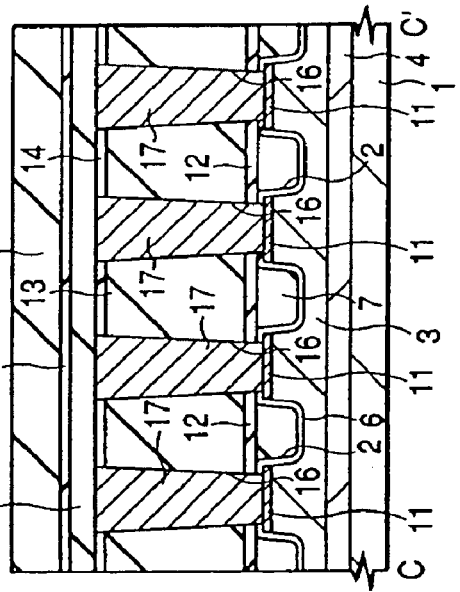
Figure 28A:
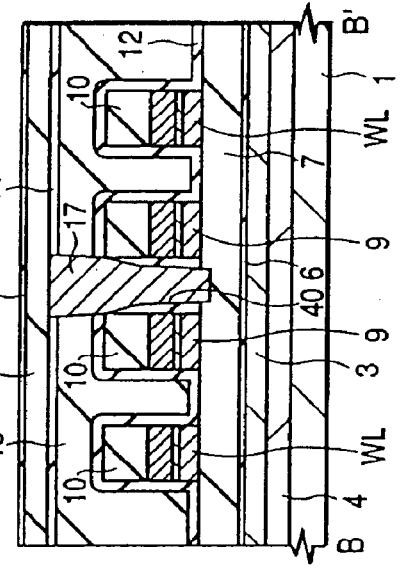
FIG. 28(A) through FIG. 28(D) are cross-sectional views showing the method of manufacturing a DRAM of preferred embodiment 2 as seen along lines A–A'; B–B'; C–C' and D–D'; respectively, in FIG. 1.
Figure 28B:
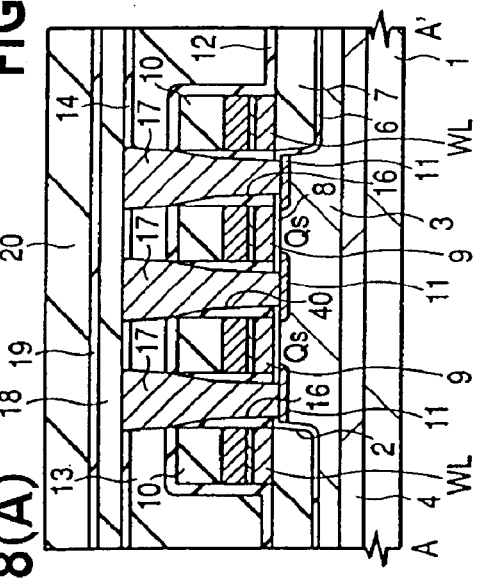
Figure 28D:
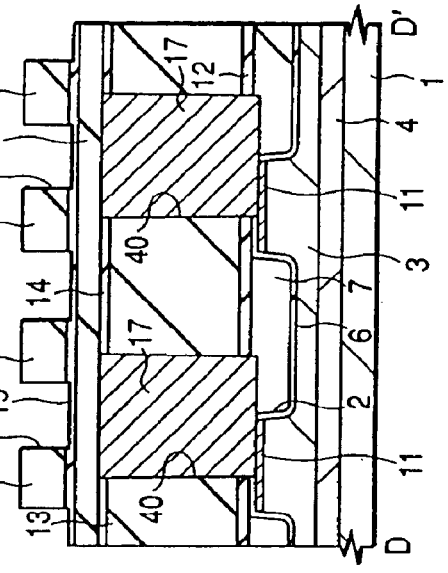
Figure 28C:
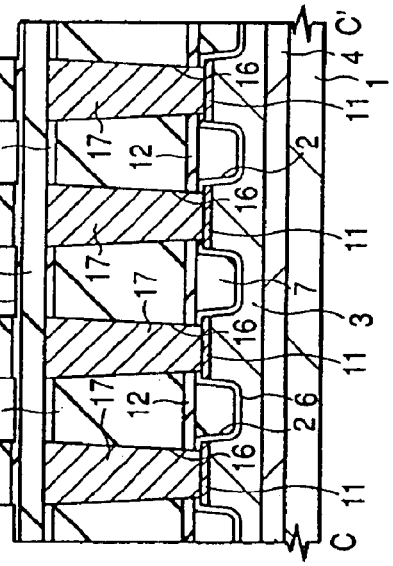
Figure 29A:
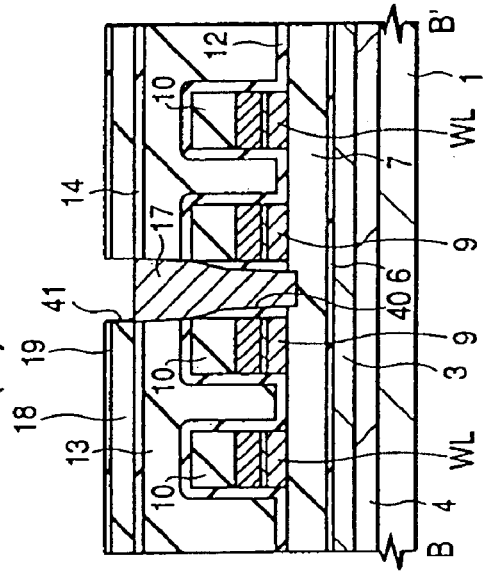
FIG. 29(A) through FIG. 29(D) are cross-sectional views showing a step of the method of manufacturing a DRAM of embodiment 2 as seen along lines A–A'; B-B'; C–C' and D–D'; respectively, in FIG. 1.
Figure 29B:
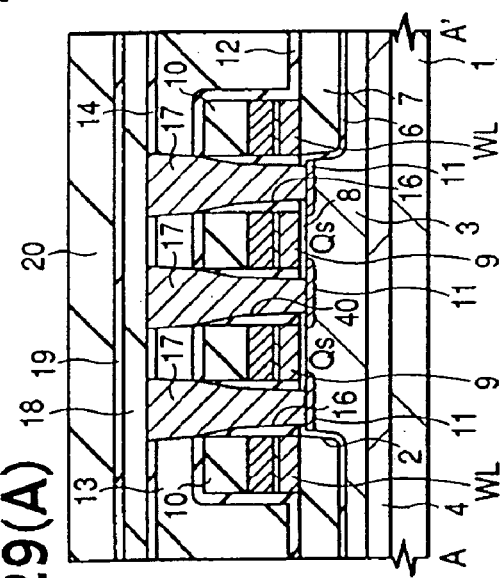
Figure 29C:
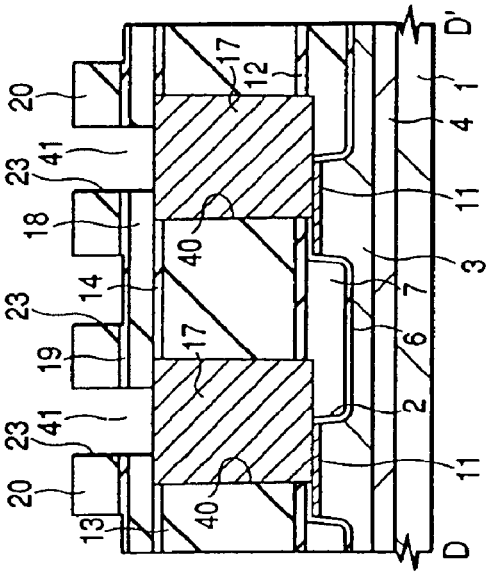
Figure 29D:
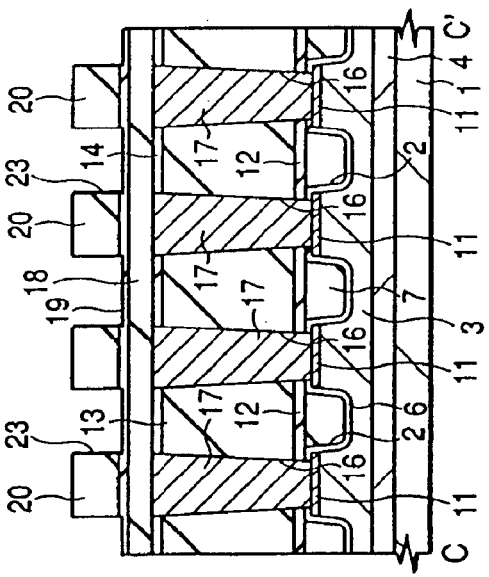
Figure 31A:
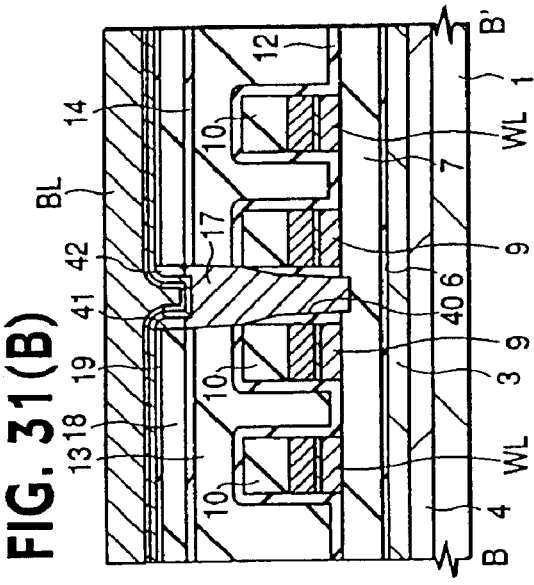
FIG. 31(A) through FIG. 31(D) are cross-sectional views showing a step of the method of manufacturing a DRAM of embodiment 2 as seen along lines A–A'; B–B'; C-C' and D-D', respectively, in FIG. 1.
Figure 31B:
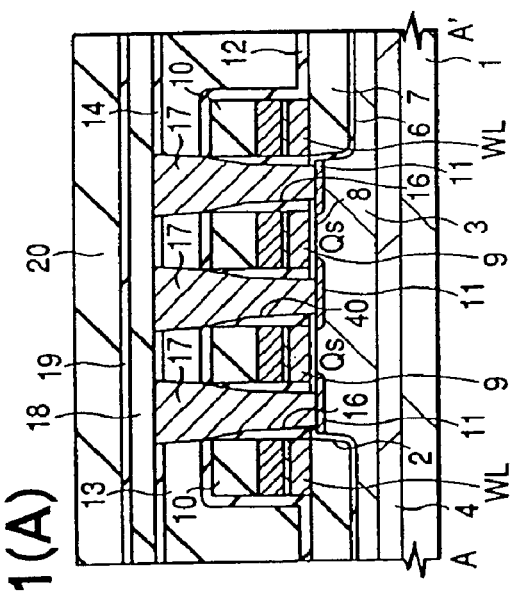
Figure 31C:
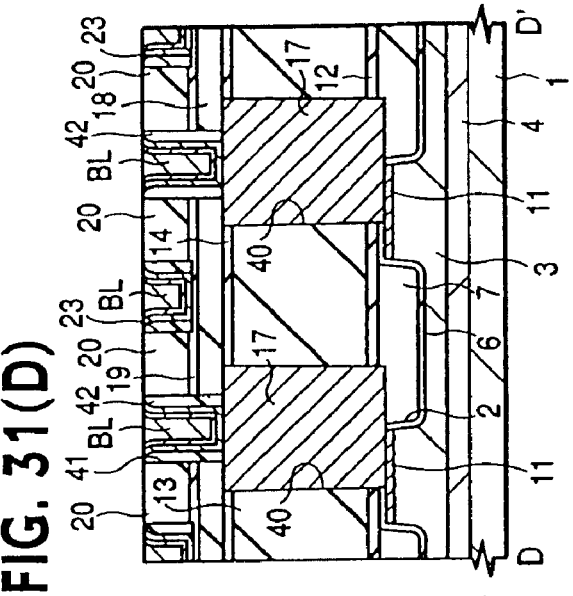
Figure 31D:
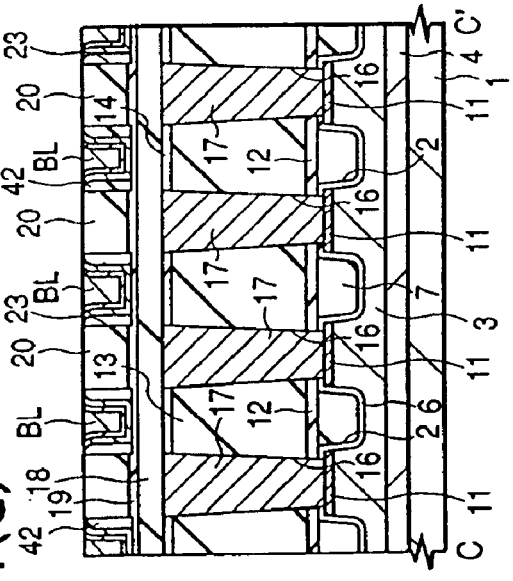

Next, as shown in FIGS. 23(A) and 23(B), on the top of the lower electrode 33, there are formed a capacitance insulating film 34 formed of a tantalum oxide film or the like and an upper electrode 35 formed of a TiN film or the like. The capacitance insulating film 34 and the upper electrode 35 are formed by depositing a thin tantalum oxide film having a thickness of about 20 nm on top of the silicon oxide film 31 including the top of the lower electrode 33 by the CVD method and then by depositing the TiN film on top of the tantalum oxide film by the CVD method and the sputtering method so that the trench 32 is filled with the TiN film and then by patterning the TiN film and the tantalum oxide film by dry-etching using a photoresist film (not shown) as a mask.

This process forms the capacitance element C for storing information, in which the lower electrode 33 is made of the polycrystalline silicon film, the capacitance insulating film 34 is formed of the tantalum oxide film, and the upper electrode 35 is made of the TiN film. Also, a memory cell of a DRAM constituted by the MISFETQs for selecting a memory cell and the capacitance element C for storing information is completed by the process described above up to this point.

Then, on top of the capacitance element C for storing information, there is formed an Al (aluminum) wiring formed of about two layers, and, further, on the Al wiring, there is formed a surface protecting film, but these films have been omitted in the drawing.

(Preferred Embodiment 2)

A bit line having a width finer than the minimum size determined by the limit of resolution of the photolithography may be also formed by the following method.

FIG. 24(A) through FIG. 24(D) are cross-sectional views of a substrate showing a state, in which a silicon nitride film 12 and a silicon oxide film 13 are deposited on top of MISFETQs for selecting a memory cell, and then the surface of the silicon oxide film 13 is planarized, and then on top of the silicon oxide film 13, there is deposited a silicon oxide film 14. The processes up to this point are the same as the processes shown from FIG. 3(A) to FIG. 8(D) of the preferred embodiment 1.

Next, as shown in FIG. 25(A) through FIG. 25(D), the silicon oxide films 14, 13 are dry-etched by using a photoresist film (not shown) as a mask, and then the silicon nitride film 12 is dry-etched to form a contact hole 16 above one of the n-type semiconductor regions 11 (source, drain) of the MISFETQs for selecting a memory cell and a contact hole 40 above the other of them (n-type semiconductor region 11 shared by two MISFETQses for selecting a memory cell). These contact holes 16, 40 are formed in a self-alignment manner to a gate electrode 9, as is the case with the above-mentioned preferred embodiment 1. Also, in order to ensure a sufficient contact area of a bit line BL to be formed above the contact hole 40 and the n-type semiconductor regions 11, the contact hole 40 is formed in a plan pattern shaped like a rectangle whose diameter is larger in the direction of a line D-D' than in the direction of a line A-A' (B-B') and is arranged so that it overlaps the projecting portion of an active region L, as is the case with the contact hole 15 of the above-mentioned preferred embodiment 1 (see FIG. 15 and FIG. 16(A) through 16(D)).

Next, as shown in FIG. 26(A) through FIG. 26(D), in each of the contact holes 16, 40, there is formed a plug 17. The plug 17 is formed by depositing a polycrystalline silicon film doped with n-type impurities such as P (phosphorus) and having low resistance on top of the silicon film 14 including the insides of the contact holes 16, 40 by the CVD method, and then by etching back the polycrystalline silicon film (or by polishing it by the CMP method) to leave the polycrystalline silicon film only in the contact holes 16, 40.

Next, as shown in FIG. 27(A) through FIG. 27(D), on the top of the silicon oxide film 14, there are sequentially deposited a silicon oxide film 18, a silicon nitride film 19 and a silicon oxide film 20 by the CVD method, and then, as shown in FIG. 28(A) through FIG. 28(D), the silicon oxide film 20 is patterned by dry-etching using a photoresist film (not shown) as a mask to form a plurality of wiring trenches 23 extending along the direction of a line A-A' in a predetermined width at predetermined intervals. As is the case with the preferred embodiment 1, the width and the interval in the direction of a line C–C' (a line D-D') of these wiring trenches 23 are made the minimum size determined by the limit of resolution of the photolithography.

Next, as shown in FIG. 29(A) through FIG. 29(D), the silicon nitride film 19 at the bottom of the wiring trench 23 and the silicon oxide film 18 are dry-etched in sequence using a photoresist film (not shown) as a mask to form a through hole 41 above the contact hole 40. The diameter of the through hole 41 is made larger than the minimum size determined by the limit of resolution of the photolithography. In this connection, the through hole 41 may be formed before the wiring trench 23 is formed. In other words, the following processes are also recommended. On the top of the silicon oxide film 14, there are deposited a silicon oxide film 18 and a silicon nitride film 19, and then the silicon nitride film 19 and silicon oxide film 18 are dry-etched to form a through hole 41 above the contact hole 40, and then on top of the silicon nitride film 19, there is deposited a silicon oxide film 20 and then, in the silicon oxide film 20, there is formed a wiring trench 23.

Next, as shown in FIG. 30(A) through FIG. 30(D), on the side wall of the wiring trench 23, there is formed a side wall spacer 42. The side wall spacer 42 is formed by depositing a silicon oxide film (not shown) on top of the silicon oxide film 20 including the inside of the wiring trench 23 by the CVD method, and then by anisotropically dry-etching the silicon oxide film to leave the silicon oxide film on the side wall of the wiring trench 23. The side wall spacer 42 is formed at the same time also on the side wall of the through hole 41.

Since the side wall spacer 42 is formed on the side wall of the wiring trench 23, the substantial width of the wiring trench 23 is made smaller than the minimum size determined by the limit of resolution of the photolithography.

Next, as shown in FIG. 31(A) through FIG. 31(D), in the wiring trench 23 including the inside of the through hole 41, there is formed a bit line BL. The bit line BL is formed by depositing a metal film of the material of the bit line BL on top of the silicon oxide film 20 including the insides of the through hole 41 and the wiring trench 23 and then by polishing the metal film by the CMP method until the surface of the silicon oxide film 20 is exposed.

Since the bit line BL formed in this way is formed in the wiring trench 23 having a width equal to the minimum size determined by the limit of resolution of the photolithography with the side wall spacer 42 therebetween, its width is made smaller than the minimum size determined by the limit of resolution of the photolithography. Accordingly, even if a memory is reduced in size, this provides an alignment margin between the through hole 28 formed between the bit lines BL in a later process and the bit line BL so as to surely prevent a short circuit from being established between the plug 29 buried in the through hole 28 and the bit line BL.

The sizes (width and thickness) of the bit line BL are controlled by controlling the thicknesses of the silicon oxide film 20 and the side wall spacer 42.

The control of the thicknesses of the silicon oxide film 20 and the side wall spacer 42 by the CVD method can reduce a variation in thickness as compared with the control thereof by a method of patterning a photoresist film finely by an isotropic etching. Accordingly, the method of the present preferred embodiment can reduce a variation in the size of the bit line BL as compared with a method of patterning the material of the bit line by the use of a photoresist film whose width is finely patterned by the isotropic etching. In other words, the method in accordance with the present preferred embodiment can form the bit lines finer than the minimum size determined by the limit of resolution of the photolithography with high accuracy.

Also, according to the method of the present preferred embodiment, the interval between the neighboring bit lines BL is made larger than the width of the bit line BL and hence the parasitic capacitance of the bit line BL can be reduced as compared with the case in which the width of the bit line BL and the interval between the neighboring bit lines BL are made the minimum size determined by the limit of resolution of the photolithography.

Then, a capacitance element C for storing information is formed on the top of the bit line BL by the similar processes shown in FIG. 18(A) to FIG. 23(B) of the preferred embodiment 1, though their illustrations are omitted, to complete a memory cell of a DRAM.

(Preferred Embodiment 3)

Next, a method for manufacturing a DRAM including peripheral circuits will be described with reference to FIG. 32(A) to FIG. 40.

First, as shown in FIG. 32(A), on a p-type well 3 of a memory array, there is formed a MISFETQs for selecting a memory cell by the above-mentioned method. Also, as shown in FIG. 32(B), on a p-type well 3 of a peripheral circuit, there is formed an n-channel type MISFETQn, and on a n-type well 5 thereof is formed a p-channel type MISFETQp. The gate electrode 9 of the n-channel type MISFETQn and the gate electrode 9 of the p-channel type MISFETQp are formed by the same processes as are used for forming the gate electrode 9 (word line WL) of the MISFETQs for selecting a memory cell. Also, the source and the drain of the n-channel type MISFETQn (n-type semiconductor regions 51) are formed by the same processes as are used for forming the source and the drain of the MISFETQs for selecting a memory cell (n-type semiconductor regions 11) and by ion-implanting n-type impurities such as arsenic (As) into portions in high concentration. The source and the drain of the p-channel type MISFETQp (p-type semiconductor regions 52) are formed by ion-implanting p-type impurities (boron) into the n-type well 5 of the peripheral circuit.

Next, as shown in FIGS. 33(A) and 33(B), on the tops of the MISFETQs for selecting a memory cell, the n-channel type MISFETQn and the p-channel type MISFETQp, there are deposited a silicon nitride film 12 and a silicon oxide film 13, and then the surface of the silicon oxide film 13 is planarized and then on the surface of the silicon oxide film 13 is deposited a silicon oxide film 14.

Then, on one of the n-type semiconductor regions 11 (source and drain) of the MISFETQs for selecting a memory cell, there is formed a contact hole 16, and then on the top of the silicon oxide film 14, there is deposited a polycrystalline silicon film doped with n-type impurities such as phosphorus (P) and having low resistance by the CVD method, and in sequence, the polycrystalline silicon film is etched back (or polished by the CMP method) to leave the polycrystalline silicon film only in the contact hole 16, whereby a plug 17 is formed. The contact hole 16 is formed in a self-alignment manner to the gate electrode 9 (word line WL), as is the case with the above-mentioned preferred embodiment 1.

Next, as shown in FIGS. 34(A) and 34(B), on top of the silicon oxide film 14, there are sequentially deposited a silicon oxide film 18, a silicon nitride film 19, and a silicon oxide film 20 by the same method as is used in the preferred embodiment 1, and then the silicon oxide film 20 is patterned by dry-etching using a photoresist (not shown) as a mask to form a wiring trench 23, and then on top of the silicon oxide film 20, including the inside of the wiring trench 23, there is deposited a silicon oxide film 21.

Figures 35A, 35B:
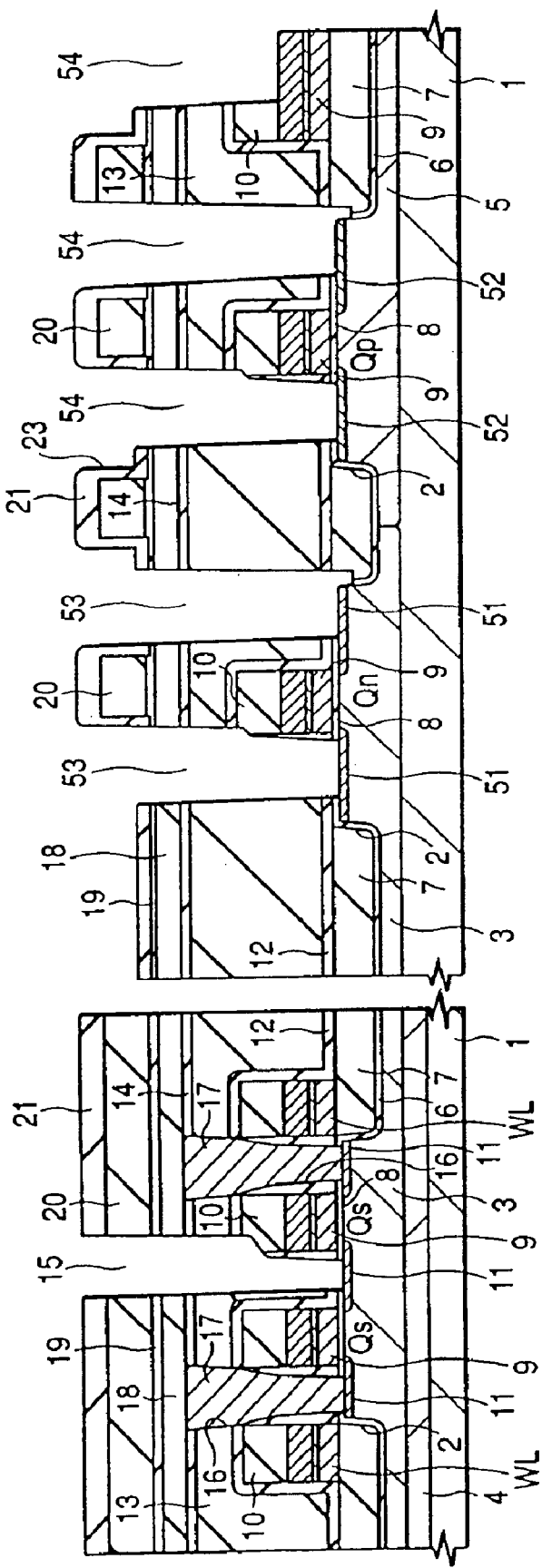
FIGS. 35(A) and 35(B) are cross-sectional views showing a step of the method of manufacturing a DRAM of embodiment 3 in accordance with the present invention.

Next, as shown in FIGS. 35(A) and 35(B), the silicon oxide films 21, 20, the silicon nitride film 19, the silicon oxide films 18, 14, 13, and the silicon nitride film 12 are dry-etched in sequence by using a photoresist film (not shown) as a mask to form a contact hole 15 above the other of the n-type semiconductor regions 11 (source and drain) of the MISFETQs for selecting a memory cell (n-type semiconductor region 11 shared by two MISFETQses for selecting a memory cell).

Also, at the same time, above the source and the drain (n-type semiconductor region 51) of the n-channel type MISFETQn of the peripheral circuit, there are formed contact holes 53, and above the gate electrode 9 the source and the drain (p-type semiconductor region 52) of the p-channel type MISFETQp, there are formed contact holes 54. The contact holes 53, 54 of the peripheral circuit are formed in a self-alignment manner to the gate electrode 9 by combining the condition under which then the etching rate of the silicon oxide to the silicon nitride is made large and the condition under which etching rate of the silicon nitride to the silicon is made large, similar to the case of the contact hole 15 of the memory array.

Next, as shown in FIGS. 36(A) and 36(B), n-type impurities (phosphorus or arsenic) are ion-implanted into the p-type well 3 through the contact hole 15 of the memory array and the contact hole 53 of the peripheral circuit to form a high-impurity concentration n+ type semiconductor region 55 in a portion of one of the source and the drain of the MISFETQs for selecting a memory cell (n-type semiconductor region 11 shared by two MISFETQses for selecting a memory cell) and a high-impurity concentration n-type semiconductor region 55 in a portion of each of the source and the drain of the n-channel type MISFETQn (n-type semiconductor region 51). Also, p-type impurities (boron) are ion-implanted into the n-type well through the contact hole 54 of the peripheral circuit to form a high-impurity concentration p-type semiconductor region 56 in a portion of each of the source and the drain of the p-channel type MISFETQp (p-type semiconductor region 52). This can reduce the resistances of the source and the drain of each of the MISFETQs for selecting a memory cell, the n-channel type MISFETQn, and the p-channel type MISFETQp.

Next, as shown in FIGS. 37(A) and 37(B), on top of the silicon oxide film 21, including the insides of the contact hole 15 and the wiring trench 23, there is deposited a metal film to be the material of a bit line BL by the same method as is used in the preferred embodiment 1, and then the metal film and the silicon oxide film 21 on top of the silicon oxide film 20 are polished by the CMP method until the surface of the silicon oxide film 20 is exposed to form the bit line BL in each of the contact hole 15 and the wiring trench 23.

Also, at the same time, on top of the silicon oxide film 21 including the insides of the contact holes 53, 54 of the peripheral circuit and the wiring trench 23, there is deposited the metal film, and then the metal film and the silicon oxide film 21 on top of the silicon oxide film 20 are polished by the CMP method until the surface of the silicon oxide film 20 is exposed to form first layer wirings 57 to 61 in each of the contact holes 53, 54 and the wiring trench 23.

The above-mentioned metal film is formed of, for example, a TiN film (Co film), a TiN film, and a W film. In this case, the Ti film (or Co film) and the TiN film are deposited, and then a substrate 1 is annealed before the W film is deposited to cause the Ti film (or Co film) to react with the substrate 1 (silicon) to form a silicide layer 62 made of Ti silicide or Co silicide at the interface between the Ti film and the substrate 1. This can reduce the resistances of the source and the drain of each of the MISFETQs for selecting a memory cell, the n-channel type MISFETQn, and the p-channel type MISFETQp, which results in improving the operating speed of these MISFETS.

In this connection, the above-mentioned bit line BL (and the first layer wirings 57 to 61) may be formed by the method used in the preferred embodiment 2; that is, it is also recommended that the side wall spacer 42 be formed on the side wall of the wiring trench 23 and that the bit line BL (and the first layer wirings 57 to 61) be formed inside the side wall spacer 42.

Then, as shown in FIGS. 38(A) and 38(B), on top of the bit line BL of the memory array, there is formed a capacitance element C for storing information having a lower electrode 33, a capacitance insulating film 34, and an upper electrode 35 by the same method as is used in the preferred embodiment 1.

Then, as shown in FIGS. 39(A) and 39(B), on top of the capacitance element C for storing information, there is deposited a silicon oxide film 63 by the CVD method, and then the silicon oxide film 63 of the peripheral circuit and the silicon oxide film 31 underlying the silicon oxide film 63, the silicon nitride film 30 and the silicon oxide film 24 are etched in sequence to form a through hole 64 above the first layer wiring 57 and a through hole 65 above the first layer wiring 58.

Next, in each of the through holes 64 and 65, there is formed a plug 66, and an Al film deposited on top of the silicon oxide film 63 is patterned to form a second layer wiring 67 electrically connected to the first layer wiring 57 through the through hole 64 and a second layer wiring 68 electrically connected to the first layer wiring 58 through the through hole 65. Also, at the same time, on top of the silicon oxide film 63 of the memory array, there is formed a second layer wiring 69. The plug 66 is formed, for example, by depositing a TiN film and a W film on top of the silicon oxide film 63 including the insides of the through holes 64, 65 by the CVD method and then by etching back (or polishing by the CMP method) these films deposited on the top of the silicon oxide film 63 to leave these films in the through holes 64, 65.

Figure 40:
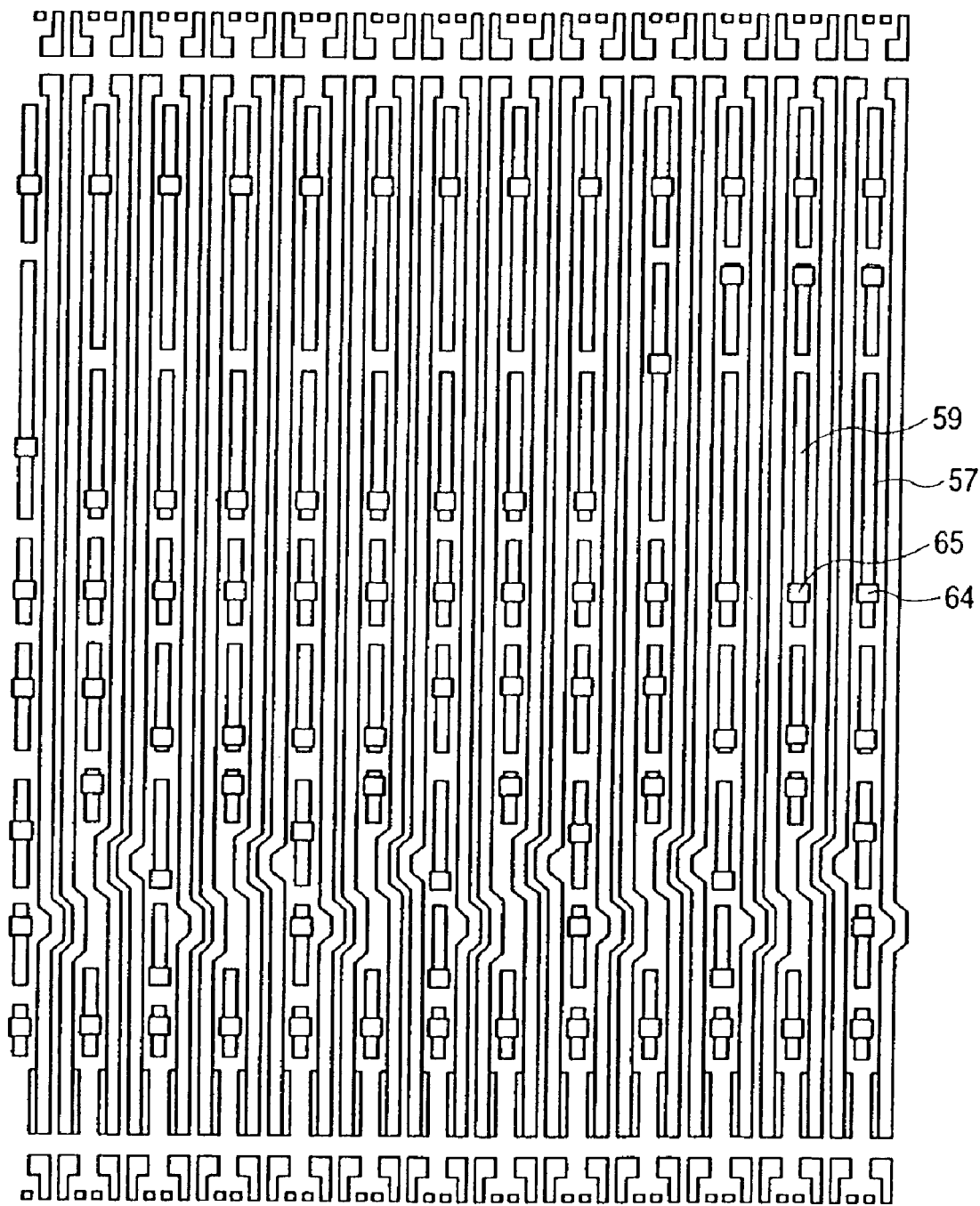
FIG. 40 is a plan view of an essential portion of a substrate showing the wiring pattern of manufacturing a DRAM of embodiment 3 in accordance with the present invention.

Also, when the above-mentioned through holes 64, 65 are formed, first, the silicon oxide films 63, 31 are etched away by using the silicon nitride film 30 as an etching stopper, and then the silicon nitride film 30 is etched away and then the silicon oxide film 24 is etched away. When the deep through holes 64, 65 extending from the surface of the silicon oxide film 63 to the surfaces of the first layer wirings 57, 58 are formed, even if the through holes 64, 65 are not aligned with the first layer wirings 57, 58, the underlying silicon oxide films 20, 21 are prevented from being etched deeply to a defective extent by stopping the etching process in the middle of the process (at the surface of the silicon nitride film 30). This eliminates the need for an alignment margin of the through holes 64, 65 and the first layer wirings 57, 58, which in turn, as shown in FIG. 40, eliminates the need for shaping into a dog bone or widening the widths of the regions of the first layer wirings 57, 58 connected to the through holes 64, 65 and hence can reduce the size of the peripheral circuit.

While the invention made by the present inventor has been described in detail up to this point on the basis of the preferred embodiments, it is not intended that the present invention is to be limited to the above-mentioned preferred embodiments, but it is needless to say that the present invention may be further modified within the spirit and scope of this disclosure.

The method of forming a bit line in accordance with the present invention can be applied not only to a DRAM but also to a logic LSI mixed with a DRAM and a microcomputer having a DRAM or a flash memory built therein.

Effects produced by the present invention disclosed in the present application will be briefly described in the following.

According to the present invention, the width of the bit line can be finer than the minimum size determined by the limit of resolution of a photolithography and hence a memory cell of a DRAM can be reduced in size.

According to the present invention, the controllability of the fine patterning of a bit line can be improved and hence the reliability and the manufacturing yield of a finely patterned DRAM can be improved.

According to the present invention, the parasitic capacitance of a bit line can be reduced and hence the detection sensitivity of a signal stored in a capacitance element for storing information can be improved.

According to the present invention, the height of the memory array of a DRAM can be reduced and hence a difference in level between the memory array and a peripheral circuit can be reduced to improve the process margin of the DRAM.

According to the present invention, the peripheral circuit of a DRAM can be reduced in size.

What is claimed is:

1. A method of manufacturing a semiconductor integrated circuit device, including a memory array having word lines extending in a first direction, bit lines extending in a second direction and memory cells located at intersections of said word lines and bit lines, said method comprising the steps of:

(a) forming on the main surface of a semiconductor substrate a selecting MISFET to select a memory cell in said memory array, which selecting MISFET is provided with a gate electrode coupled to a word line extending in the first direction and then forming a first insulating film over the selecting MISFET;

(b) etching the first insulating film to form a second contact hole extending to one of a pair of source and drain of the selecting MISFET and then forming a plug in the second contact hole;

(c) forming over the first insulating film a third insulating film which is different in an etching rate from the first insulating film and then forming over the third insulating film a fourth insulating film which is different in an etching rate from the third insulating film;

(d) etching the fourth insulating film by using the third insulating film as an etching stopper to form a wiring trench extending in the second direction intersecting the first direction;

(e) forming a second insulating film having a thickness smaller than half the width of the wiring trench over the fourth insulating film including the inside of the wiring trench;

(f) sequentially etching the second insulating film inside the wiring trench, a part of the fourth insulating film, the third insulating film below it, and the first insulating film and removing a part of the first insulating film on a device isolation region to form a first contact hole extending to the other of the pair of source and drain of the selecting MISFET; and (g) depositing a first conductive film to be the material of the bit lines over the second insulating film including the inside of the first contact hole, and then polishing the first conductive film and the second insulating film over the fourth insulating film to form a bit line in each of the wiring trench and the first contact hole.

2. The method of manufacturing the semiconductor integrated circuit device as claimed in claim 1, wherein the width of a gate electrode coupled to the word line and the interval between the gate electrodes are formed in the minimum size determined by the limit of resolution of a photolithography process and wherein the width of the wiring trench and the interval between the wiring trenches are formed in the minimum size determined by the limit of resolution of the photolithography process.

3. The method of manufacturing the semiconductor integrated circuit device as claimed in claim 1, wherein, after the first contact hole extending to one of the pair of source and drain of the selecting MISFET is formed in the step (f), impurity ions of the same conductivity type as are used in the pair of source and drain are implanted into one of the pair of source and drain through the first contact hole.

4. The method of manufacturing the semiconductor integrated circuit device as claimed in claim 1, wherein, after a metal film having a high melting point and to be the material of the bit line is deposited in the first through hole in the step (g), the substrate is annealed to form a suicide layer at the interface between the metal film having the high melting point and the substrate.

5. The method of manufacturing the semiconductor integrated circuit device as claimed in claim 1, further comprising the steps of:

(h) forming a fifth insulating film over the fourth insulating film and then sequentially etching the fifth insulating film, the fourth insulating film underlying the fifth insulating film, and the third insulating film to form a second through hole extending to said plug formed in the second contact hole and forming a plug in the second through hole;

(i) forming over the fifth insulating film a sixth insulating film which is different in an etching rate from the fifth insulating film and then forming a seventh insulating film over the sixth insulating film and then forming a trench in the seventh insulating film and the sixth insulating film underlying the seventh insulating film; and (j) forming a capacitance element for storing information in the trench, and then electrically connecting the capacitance element for storing information to said one of the pair of source and drain of the MISFET for selecting the memory cell through the second through hole and the second contact hole below the second through hole.

6. The method of manufacturing the semiconductor integrated circuit device as claimed in claim 5, wherein the fifth insulating film and the fourth insulating film are etched away by using the third insulating film as an etching stopper.

7. The method of manufacturing the semiconductor integrated circuit device as claimed in claim 5, further comprising the steps of:

(k) forming the MISFET of a peripheral circuit in the step (a);

(l) forming the first layer wiring of the peripheral circuit in the step (g); and (m) forming an eighth insulating film over the capacitance element for storing information after forming the capacitance element for storing information in the step (j) and then sequentially etching the eighth insulating film, the seventh insulating firm, the sixth insulating film, and the fifth insulating film to form a through hole extending to the first layer wiring of the peripheral circuit.

8. The method of manufacturing the semiconductor integrated circuit device as claimed in claim 7, wherein the eighth insulating film and the seventh insulating film are etched away by using the sixth insulating film as an etching stopper.

9. A method of manufacturing a semiconductor integrated circuit device, including a memory array having word lines extending in a first direction, bit lines extending in a second direction and memory cells located at intersections of said word lines and bit lines, said method comprising the steps of:

(a) forming on the main surface of a semiconductor substrate a selecting MISFET to select a memory cell in the memory array, which selecting MISFET is provided with a gate electrode coupled to a word line extending in the first direction and then forming a first insulating film over the selecting MISFET;

(b) etching the first insulating film to form a first contact hole extending to one of a pair of source and drain of the selecting MISFET and a part of a device isolation region and a second contact hole extending to the other of the pair of source and drain and then forming a plug in each of the first and second contact holes;

(c) forming over the first insulating film a third insulating film which is different in an etching rate from the first insulating film and then forming over the third insulating film a fourth insulating film which is different in an etching rate from the third insulating film;

(d) etching the fourth insulating film by using the third insulating film as an etching stopper to form a wiring trench extending in the second direction intersecting the first direction;

(e) etching the third insulating film to form a first through hole connecting with the plug formed in the first contact hole;

(f) forming a second insulating film over the fourth insulating film including the inside of the wiring trench;

(g) etching the second insulating film to form a side wall spacer over the side wall of the wiring trench; and (h) depositing a first conductive film to be the material of a bit line over the second insulating film including the inside of the first through hole and then polishing the first conductive film to form a bit line in each of the wiring trench and the first through hole.

10. The method of manufacturing the semiconductor integrated circuit device as claimed in claim 9, wherein the width of a gate electrode coupled to the word line and the interval between the gate electrodes are formed in the minimum size determined by the limit of resolution of a photolithography process and wherein the width of the wiring trench and the interval between the wiring trenches are formed in the minimum size determined by the limit of resolution of the photolithography process.

11. The method of manufacturing the semiconductor integrated circuit device as claimed in claim 9, wherein, after a metal film having a high melting point and to be the material of the bit line is deposited in the first through hole in the step (h), the substrate is annealed to form a silicide layer at the interface between the metal film having the high melting point and the plug.

12. The method of manufacturing the semiconductor integrated circuit device as claimed in claim 9, further comprising the steps of:

(h) forming a fifth insulating film over the fourth insulating film and then sequentially etching the fifth insulating film, the fourth insulating film underlying the fifth insulating film, the third insulating film, to form a second through hole extending to the plug formed in the second contact hole and forming a plug in the second through hole and;

(i) forming over the fifth insulating film a sixth insulating film which is different in an etching rate from the fifth insulating film and then forming a seventh insulating film over the sixth insulating film and then forming a trench in the seventh insulating film and the sixth insulating film underlying the seventh insulating film; and (j) forming a capacitance element for storing information in the trench, and then electrically connecting the capacitance element for storing information to the other of the pair of source and drain of the MISFET for selecting the memory cell through the second through hole and the second contact hole below the second through hole.

* * * * *